United States Patent
Jo et al.

(10) Patent No.: US 12,200,887 B2
(45) Date of Patent: Jan. 14, 2025

(54) ELECTRONIC DEVICE INCLUDING FLEXIBLE DISPLAY

(71) Applicant: Samsung Electronics Co., Ltd., Suwon-si (KR)

(72) Inventors: Youngkyong Jo, Suwon-si (KR); Wooktae Kim, Suwon-si (KR); Taehyeong Ryu, Suwon-si (KR); Jungkyu Park, Suwon-si (KR); Youngmin Seo, Suwon-si (KR); Bora Lee, Suwon-si (KR); Sangbong Lee, Suwon-si (KR); Wonho Lee, Suwon-si (KR); Jongsu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 18/155,355

(22) Filed: Jan. 17, 2023

(65) Prior Publication Data

US 2023/0156947 A1    May 18, 2023

Related U.S. Application Data

(63) Continuation of application No. PCT/KR2022/014998, filed on Oct. 5, 2022.

(30) Foreign Application Priority Data

Oct. 5, 2021 (KR) .......................... 10-2021-0131870
Jan. 28, 2022 (KR) .......................... 10-2022-0013740
Sep. 30, 2022 (KR) .......................... 10-2022-0125745

(51) Int. Cl.
*H05K 5/03* (2006.01)
*B32B 3/26* (2006.01)
(Continued)

(52) U.S. Cl.
CPC ............... *H05K 5/03* (2013.01); *B32B 3/266* (2013.01); *B32B 3/30* (2013.01); *B32B 7/12* (2013.01);
(Continued)

(58) Field of Classification Search
CPC ....................................................... H05K 5/03
See application file for complete search history.

(56) References Cited

U.S. PATENT DOCUMENTS 10,216,230 B2    2/2019   Kim et al.
10,656,434 B2    5/2020   Liu et al.
(Continued)

FOREIGN PATENT DOCUMENTS

JP   WO2016/136662 A1   11/2017
KR   10-1482401 A       1/2015
(Continued)

OTHER PUBLICATIONS

International Search Report dated Jan. 6, 2023, issued in International Application No. PCT/KR2022/014998.
(Continued)

*Primary Examiner* — Sherman Ng
(74) *Attorney, Agent, or Firm* — Jefferson IP Law, LLP

(57) ABSTRACT

An electronic device is provided. The electronic device includes a foldable housing and a flexible display. The foldable housing may provide a front surface of the electronic device and a rear surface of the electronic device. The flexible display may be located in an inner space of the foldable housing. The flexible display may be combined with a front cover of the foldable housing providing the front surface. The front cover may include a pattern in which a plurality of openings corresponding to a folding portion of the foldable housing or a plurality of recesses provided in a surface facing the flexible display are periodically provided.

(Continued)

A plurality of sub-pixels emitting light of a same wavelength in the flexible display may be arranged in a same direction as a direction in which the plurality of openings or the plurality of recesses are periodically arranged.

20 Claims, 18 Drawing Sheets

(51) Int. Cl.
　　*B32B 3/30*　　　(2006.01)
　　*B32B 7/12*　　　(2006.01)
　　*B32B 17/10*　　　(2006.01)
　　*B32B 27/08*　　　(2006.01)

(52) U.S. Cl.
　　CPC ........ *B32B 17/10005* (2021.01); *B32B 27/08* (2013.01); *B32B 2307/558* (2013.01); *B32B 2307/732* (2013.01); *B32B 2457/20* (2013.01)

(56) References Cited

U.S. PATENT DOCUMENTS

| | | | |
|---|---|---|---|
| 10,678,359 | B2 | 6/2020 | Cho et al. |
| 10,957,224 | B2 | 3/2021 | Chen |
| 11,610,520 | B2 | 3/2023 | Park et al. |
| 2014/0029212 | A1 | 1/2014 | Hwang et al. |
| 2014/0320438 | A1 | 10/2014 | Yurlov et al. |
| 2017/0061836 | A1* | 3/2017 | Kim .................... G06F 1/1626 |
| 2018/0046292 | A1 | 2/2018 | Miyazaki et al. |
| 2019/0087044 | A1 | 3/2019 | Cho et al. |
| 2019/0131553 | A1* | 5/2019 | Park ...................... G06F 1/1652 |
| 2019/0339739 | A1* | 11/2019 | Park ...................... H04M 1/0218 |
| 2019/0347965 | A1 | 11/2019 | Chen |
| 2020/0395433 | A1 | 12/2020 | Sung et al. |
| 2021/0104694 | A1 | 4/2021 | Yee |
| 2021/0191467 | A1 | 6/2021 | Sunwoo et al. |
| 2021/0216100 | A1 | 7/2021 | Smeeton |
| 2021/0225989 | A1 | 7/2021 | Ryu et al. |
| 2021/0287576 | A1 | 9/2021 | Park et al. |
| 2022/0075979 | A1* | 3/2022 | Han ...................... G06V 40/1318 |
| 2023/0099802 | A1 | 3/2023 | An et al. |

FOREIGN PATENT DOCUMENTS

| | | |
|---|---|---|
| KR | 10-2016-0017843 A | 2/2016 |
| KR | 10-2017-0023231 A | 3/2017 |
| KR | 10-2018-0018925 A | 2/2018 |
| KR | 10-2019-0032056 A | 3/2019 |
| KR | 10-2021-0047616 A | 4/2021 |
| KR | 10-2262991 B1 | 6/2021 |
| KR | 10-2021-0093401 A | 7/2021 |
| KR | 10-2021-0116774 A | 9/2021 |
| KR | 10-2021-0116893 A | 9/2021 |

OTHER PUBLICATIONS

European Search Report dated Nov. 29, 2024, issued in European Application No. 22878886.5.

* cited by examiner

ELECTRONIC DEVICE INCLUDING FLEXIBLE DISPLAY

CROSS-REFERENCE TO RELATED APPLICATION(S)

This application is a continuation application, claiming priority under § 365 (c), of an International application No. PCT/KR2022/014998, filed on Oct. 5, 2022, which is based on and claims the benefit of a Korean patent application number 10-2021-0131870, filed on Oct. 5, 2021, in the Korean Intellectual Property Office, of a Korean patent application number 10-2022-0013740, filed on Jan. 28, 2022, in the Korean Intellectual Property Office, and of a Korean patent application number 10-2022-0125745, filed on September 30, the Korean Intellectual Property Office, the disclosure of each of which is incorporated by reference herein in its entirety.

TECHNICAL FIELD

The disclosure relates to an electronic device including a flexible display.

BACKGROUND ART

Electronic devices are being designed to provide a larger screen while having a portable size that does not cause inconvenience to a user's hand. The electronic device may be implemented as, for example, a foldable type in which a screen can be folded or unfolded.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

The foldable electronic device may include, for example, a lattice structure for contributing to flexibility in a corresponding folding area of a screen. The lattice structure can affect the visual quality of the screen.

Aspects of the disclosure are to address at least the above-mentioned problems and/or disadvantages and to provide at least the advantages described below. Accordingly, an aspect of the disclosure is to provide an electronic device including a flexible display for reducing visual quality degradation due to a lattice structure located in a folding area of a screen.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a foldable housing and a flexible display. The foldable housing may provide a front surface of the electronic device and a rear surface of the electronic device. The flexible display may be located in an inner space of the foldable housing, combined with a front cover of the foldable housing providing the front surface, and viewable through the front cover. The front cover may include a pattern in which a plurality of openings corresponding to a folding portion of the foldable housing or a plurality of recesses provided in a surface facing the flexible display are periodically provided. A plurality of sub-pixels emitting light of a same wavelength in the flexible display may be arranged in a same direction as a direction in which the plurality of openings or the plurality of recesses are periodically arranged. A first interval at which the plurality of openings or the plurality of recesses are periodically arranged may be greater than a second interval at which the plurality of sub-pixels are periodically arranged.

Advantageous Effects of Invention

The electronic device including the flexible display according to various embodiments of the disclosure may reduce visual quality degradation (e.g., a moire visible phenomenon) due to a lattice structure positioned in a folding area of a screen.

In addition, effects obtainable or predictable from various embodiments of the disclosure will be explicitly or implicitly provided in the detailed description of the embodiments of the disclosure. For example, various effects predicted according to various embodiments of the disclosure will be described in the following description.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

MODE FOR THE INVENTION

Figure 1:
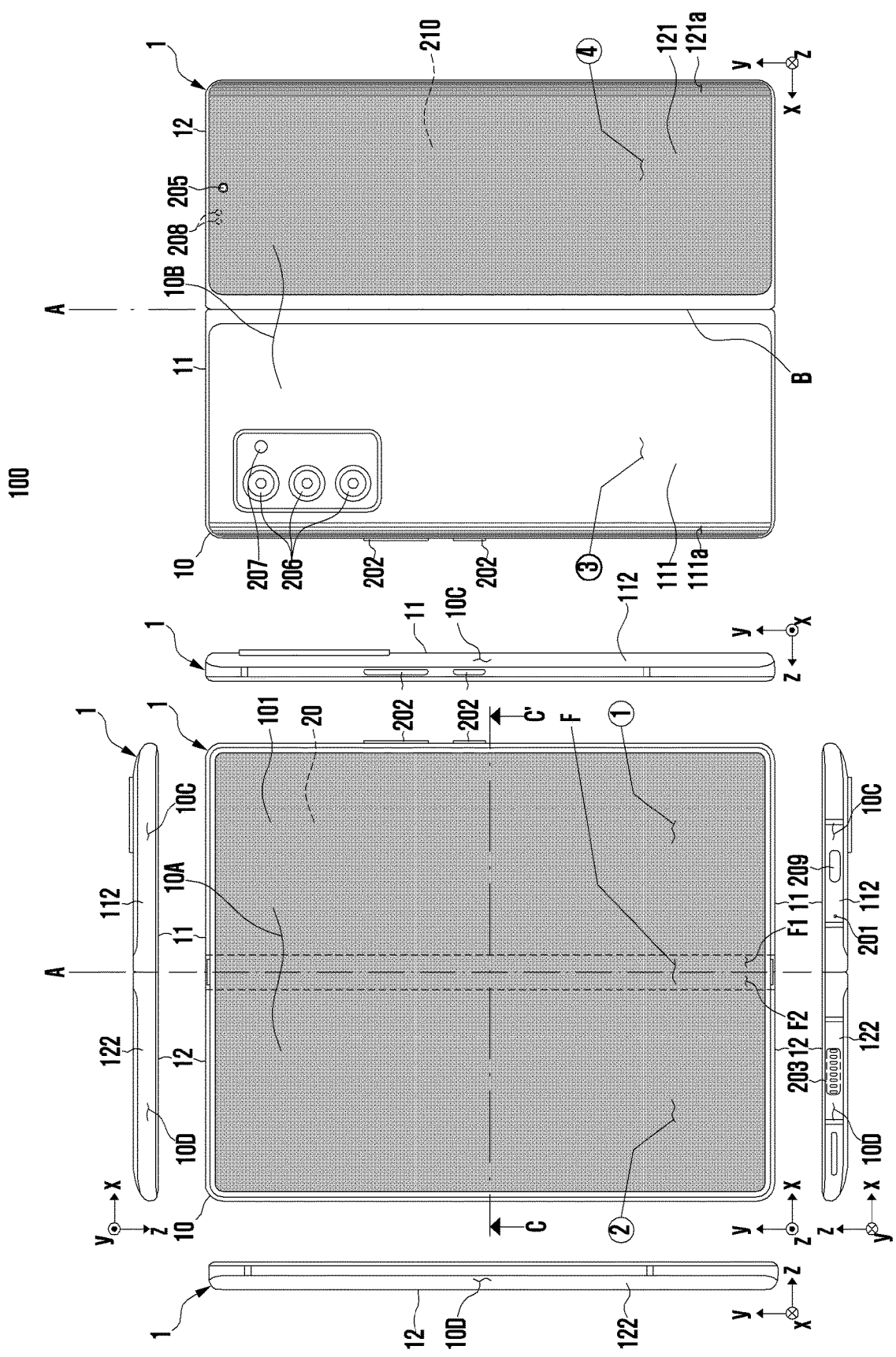
FIG. 1 is diagrams illustrating an electronic device in an unfolded state, according to an embodiment of the disclosure.

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B", "at least one of A and B", "at least one of A or B", "A, B, or C", "at least one of A, B, and C", and "at least one of A, B, or C" may include all possible combinations of the items enumerated together in a corresponding one of the phrases. As used herein, such terms as "1$^{st}$" and "2$^{nd}$", or "first" and "second" may be used to simply distinguish a corresponding component from another, and does not limit the components in other aspect (e.g., importance or order).

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

FIG. 1 is a diagram illustrating an electronic device 1 in an unfolded state (or a flat state or an unfolding state), according to an embodiment of the disclosure.

Figure 2:
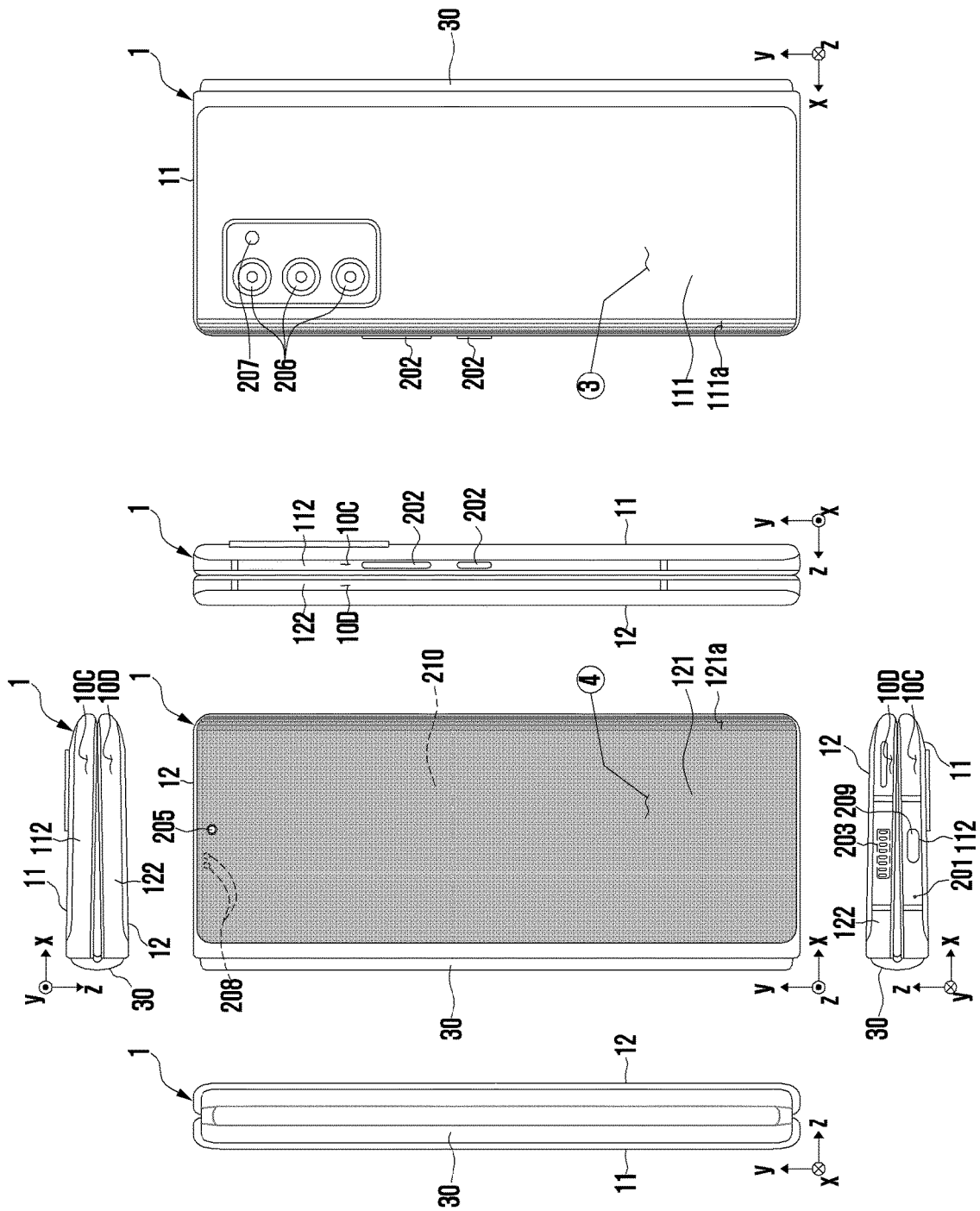
FIG. 2 is diagrams illustrating an electronic device in a folded state, according to an embodiment of the disclosure.

FIG. 2 is a diagram illustrating an electronic device 1 in a folded state (or a folding state), according to an embodiment of the disclosure.

Referring to FIGS. 1 and 2 the electronic device (or foldable electronic device) 1 may include a foldable housing 10 and a flexible display (or, a flexible display module, a bendable display, or a bendable display module) 20. The foldable housing 10 may have a front surface 10A of the electronic device 1 and a rear surface 10B of the electronic device 1 opposite to the front surface 10A. For better understanding, the front surface 10A of the electronic device 1 is interpreted as a surface where the flexible display 20 is exposed to the outside, and the rear surface 10B of the electronic device 1 is interpreted as a surface located opposite to the front surface 10A. The foldable housing 10 may have a first side surface 10C and a second side surface 10D of the electronic device 1 at least partially surrounding a space between the front surface 10A and the rear surface 10B.

The front surface 10A may include a first cover area ⓐ, a second cover area ⓑ, and a folding cover area F between the first cover area ⓐ and the second cover area ⓑ. In the unfolded state of the foldable housing 10 (or the electronic device 1), the front surface 10A may be substantially planar, and all of the first cover area ⓐ, the second cover area ⓑ, and the folding cover area F may face substantially in the same direction. The rear surface 10B may include a third cover area ⓒ and a fourth cover area ⓐ. The third cover area ⓒ is positioned on the opposite side to the first cover area ⓐ of the front surface 10A and may face in the opposite direction to the first cover area ⓐ. The fourth cover area ⓓ is positioned on the opposite side to the second cover area ⓑ of the front surface 10A and may face in the opposite direction to the second cover area ⓑ.

The foldable housing 10 may be implemented in an in-folding structure that the front surface 10A is foldable inward. For example, in the unfolded state (see FIG. 1) of the foldable housing 10, the folding cover area F is disposed in a planar shape, and the first cover area ⓐ and the second cover area ⓑ may form an angle of about 180 degrees. In the folded state (see FIG. 2) of the foldable housing 10, the folding cover area F is disposed in a curved shape, and the first cover area ⓐ and the second cover area ⓑ may form an angle different from about 180 degrees. The folded state may include a fully folded state or an intermediate state. The fully folded state (see FIG. 2) may be a folded state in which the first cover area ⓐ and the second cover area ⓑ of the front surface 10A are arranged so that they do not come close any more. In the fully folded state, the first cover area ⓐ and the second cover area ⓑ may form, for example, an angle of about 0 degrees to about 10 degrees. In the fully folded state, the front surface 10A may not be substantially exposed to the outside. The intermediate state may refer to (or may be defined or interpreted as) a state between the unfolded state and the fully folded state. The folding cover area F of the front surface 10A may be more curved in the fully folded state than in the intermediate state. In some embodiments, the electronic device 1 may be implemented in an out-folding structure that the front surface 10A (or the screen) is foldable outward (not shown separately).

The foldable housing 10 may include a front cover (e.g., a window) 101 that provides (or forms) at least in part the front surface 10A. The flexible display 20 may be positioned in an internal space of the electronic device 1 while overlapping at least in part with the front cover 101. The front cover 101 may protect the flexible display 20 from the outside and may be substantially transparent. Light outputted from the flexible display 20 may pass through the front cover 101 and travel to the outside. The flexible display 20 may include, for example, a first display area (or first active area) overlapping with the first cover area ⓐ of the front surface 10A, a second display area (or second active area) overlapping with the second cover area ⓑ of the front surface 10A, and a third display area (or third active area) overlapping with the folding cover area F. The third display area may be referred to as various other terms such as a 'folding display area', a 'foldable display area', or a 'bendable display area'. The screen may refer to (or be defined or interpreted as) a region in which an image can be displayed in a device including the flexible display 20 and the front cover 101, and may include, for example, the display area of the flexible display 20 and an overlapping area of the front cover 101.

The front cover 101 may be provided (or formed) integrally with the flexible display 20 as a component included in the flexible display 20. In the case that the front cover 101 is defined or interpreted as a component included in the flexible display 20, the front cover 101 may be excluded from the foldable housing 20. The front cover 101 may be implemented in the form of a thin film to have flexibility. The front cover 101 may include, for example, a plastic film (e.g., polyimide film) or thin glass (e.g., ultra-thin glass (UTG)). The front cover 101 may include a plurality of layers. For example, the front cover 101 may have a form (not shown separately) in which a coating layer or protective layer of various polymer materials (e.g., polyester (PET), polyimide (PI), or thermoplastic polyurethane (TPU)) is disposed on a plastic film or a thin glass.

The foldable housing 10 may include a first housing (or a first housing portion or a first housing structure) 11, a second housing (or a second housing portion or a second housing structure) 12, and a folding portion (or a foldable portion, a folding area, a bendable portion, or a bendable area) between the first housing 11 and the second housing 12. Coordinate axes shown for better understanding are based on the first housing 11, the first cover area ⓐ may substantially face in the positive z-axis direction, and the third cover area ⓒ may substantially face in the negative z-axis direction. The first housing 11 and the second housing 12 are connected by the folding portion and may be mutually rotatable based on a folding axis A of the foldable housing 10. The folding portion may include, for example, a hinge assembly (or hinge structure) (not shown separately). The folding axis A may be a rotation axis of the hinge assembly. In the illustrated example, the folding axis A may be parallel to the y-axis direction.

The first housing 11 may include a first cover portion of the front cover 101 positioned on one side with respect to the folding axis A, a first rear cover 111 providing (or forming) at least in part the third cover area ⓒ of the rear surface 10B, and a first side member (or first side bezel structure) 112 surrounding at least in part a space between the first cover portion and the first rear cover 111 and providing (or forming) the first side surface 10C. The first cover portion of the front cover 101 may provide (or form), for example, the first cover area ⓐ and a first folding cover area F1 of the folding cover area F located on one side with respect to the folding axis A.

The second housing 12 may include a second cover portion of the front cover 101 positioned on one side with respect to the folding axis A, a second rear cover 121 providing (or forming) at least in part the fourth cover area ⓓ of the rear surface 10B, and a second side member (or second side bezel structure) 122 surrounding at least in part a space between the second cover portion and the second rear cover 121 and providing (or forming) the second side surface 10D. The second cover portion of the front cover 101 may provide (or form), for example, the second cover area ⓑ and a second folding cover area F2 of the folding cover area F located on the other side with respect to the folding axis A. In the fully folded state of the foldable housing 10, the first side member 112 and the second side member 122 may be aligned to overlap at least partially.

The first side member 112 and/or the second side member 122 may be provided by (or formed of), for example, ceramic, polymer, metal (e.g., aluminum, stainless steel, or magnesium), or a combination of at least two of the above materials. The first side member 112 and/or the second side member 122 may include, for example, various metallic materials such as titanium, an amorphous alloy, a metal-ceramic composite material (e.g., cermet), stainless steel, magnesium, a magnesium alloy, aluminum, an aluminum alloy, a zinc alloy, or a copper alloy. The first rear cover 111 and/or the second rear cover 121 may be substantially opaque. The first rear cover 111 and/or the second rear cover 121 may be provided by (or formed of), for example, coated or colored glass, ceramic, polymer, metal (e.g., aluminum, stainless steel, or magnesium), or a combination of at least two of the above materials. For example, using a plate of various materials, such as transparent glass, ceramic, or polymer, and coating, the first rear cover 111 or the second rear cover 121 may include at least one coating layer (not shown separately) disposed on the plate. In another example, the first rear cover 111 or the second rear cover 121 may include a plate of various materials such as transparent glass, ceramic, or polymer, and a film (e.g., a decoration film, not shown separately) having various visual effects attached to the plate. The first rear cover 111 and the first side member 112 may be provided (or formed) integrally and may include the same material. In some embodiments, the second rear cover 121 and the second side member 122 may be provided (or formed) integrally and may include the same material.

According to an embodiment, the folding portion may include a hinge housing 30. The hinge housing 30 may cover at least one hinge connecting the first housing 11 and the second housing 12. The hinge housing 30 may be referred to as a 'hinge cover'. When the electronic device 1 is switched from the unfolded state of FIG. 1 to the folded state of FIG. 2, the hinge housing 30 may cover a gap B opened between the first housing 11 and the second housing 12 so that the inside of the electronic device 1 is not exposed. As shown in FIG. 1, in the unfolded state of the electronic device 1, the gap B may be substantially absent, and the hinge housing 30 may not be exposed to the outside because it is covered by the first housing 11 and the second housing 12. Although not shown, in the intermediate state of the electronic device 1, the hinge housing 30 may be partially exposed between the first housing 11 and the second housing 12. The hinge housing 30 may be more exposed in the folded state of FIG. 2 than in the intermediate state.

The foldable housing 10 may refer to a structure (e.g., a foldable housing structure or a foldable housing assembly) that provides (or forms) at least a part of the front surface 10A, the rear surface 10B, the first side surface 10C, and the second side surface 10D. For example, the foldable housing 10 may include a first housing portion, a second housing part, and a folding portion connected to the first housing portion and the second housing portion. The folding portion may refer to (or may be defined or interpreted as) a part more flexible than the first housing portion and the second housing portion and may be bent in the folded state of the electronic device 1. The folding portion may include, for example, a hinge assembly. In another example, the folding portion may include a structure (e.g., a multi-bar structure) in which a plurality of bars are arranged. Without limited to the above examples, the folding portion may be implemented in various other structures connecting the first and second housing portions and having a bending characteristic.

According to an embodiment of the disclosure, the electronic device 1 may include another display (hereinafter, sub-display) 210 positioned inside the first housing 11 and adjacent to the first rear cover 111. A portion of the first rear cover 111 may overlap with the sub-display 210 and may be substantially transparent. The electronic device 1 may output an image using the sub-display 210 instead of the flexible display 20 in the folded state of FIG. 2.

The second rear cover 121 may include a second curved area 121a that is bent from the fourth cover area ⓓ toward the second cover area ⓑ and extends seamlessly. The second curved area 121a may be provided (or formed) adjacent to a long edge of the second rear cover 121 that is substantially parallel to the folding axis A. The sub-display 210 may include a flexible display that may be disposed in a shape corresponding thereto.

The first rear cover 111 may include a first curved area 111a that is bent from the third cover area ⓒ toward the first cover area ⓐ and extends seamlessly. The first curved area 111a may be provided (or formed) adjacent to a long edge of the first rear cover 111 that is substantially parallel to the folding axis A. For example, in the unfolded state (see FIG. 1) or the folded state (see FIG. 2) of the electronic device 1, for the sake of aesthetics, the first curved area 111a and the second curved area 121a may be positioned substantially symmetrically opposite to each other. In some embodiments, the first curved area 111a or the second curved area 121a may be omitted.

The electronic device 1 may include an input module, a sound output module, a camera module, a sensor module, or a connection terminal. In some embodiments, the electronic device 1 may omit at least one of the above components or additionally include other components. The positions or number of components included in the electronic device 1 may be not limited to the illustrated example and may vary.

The input module may include, for example, a microphone positioned inside the electronic device 1, and a microphone hole 201 provided (or formed) in the first side surface 10C corresponding to the microphone. The position or number of the input module including the microphone and the corresponding microphone hole 201 is not limited to the illustrated example and may vary. According to an embodiment of the disclosure, the electronic device 1 may include a plurality of microphones capable of detecting the direction of sound.

The input module may include, for example, key input devices 202. The key input devices 202 may be positioned, for example, in an opening (not shown) provided (or formed) in the first side surface 10C. The electronic device 1 may omit some or all of the key input devices 202, and non-included input devices may be implemented as soft keys using the flexible display 20 or the sub-display 210. The input module may include at least one sensor module.

The sound output module may include, for example, a speaker located inside the electronic device 1, and a speaker hole 203 provided (or formed) in the second side surface 10D corresponding to the speaker. The position or number of the sound output module including the speaker and the corresponding speaker hole 203 is not limited to the illustrated example and may vary. The microphone hole 201 and the speaker hole 203 may be implemented as one hole. A piezo speaker without the speaker hole 203 may be implemented. The sound output module may include, for example, a call receiver located inside the electronic device 1, and a receiver hole (not shown) provided (or formed) in the fourth cover area ⓓ corresponding to the call receiver.

The camera module may include, for example, a first camera module (or front camera module) 205 positioned to correspond to the fourth cover area ⓓ, or a plurality of second camera modules (or rear camera modules) 206 located to correspond to the third cover area ⓒ. The first camera module 205 and/or the plurality of second camera modules 206 may include one or more lenses, an image sensor, and/or an image signal processor. The position or number of the first camera module 205 or the plurality of second camera modules 206 is not limited to the illustrated example and may vary.

The sub-display 210 may include an opening aligned with the first camera module 205. External light may pass through the openings of the second rear cover 121 and the sub-display 210 and reach the first camera module 205. Depending on the position of the first camera module 205, the opening of the sub-display 210 may be provided (or formed) in the form of a notch. The first camera module 205 may be located on the rear surface of the sub-display 210 or below or beneath the sub-display 210, and the first camera module 205 may perform a related function (e.g., taking an image) without visually distinguishing (or exposing) its position. For example, the first camera module 205 may include a hidden display rear camera (e.g., an under display camera (UDC)). The first camera module 205 may be aligned and positioned in a recess provided (or formed) in the rear surface of the sub-display 210. The first camera module 205 may be disposed to overlap with at least a portion of the screen and may acquire an image of an external subject without being visually exposed to the outside. In this case, a portion of the sub-display 210 that overlaps at least in part with the first camera module 205 may include a pixel structure and/or a wiring structure different from the other portion. For example, a portion of the sub-display 210 that overlaps at least in part with the first camera module 205 may have a different pixel density (e.g., the number of pixels per unit area) compared to the other portion (not shown separately). A pixel structure and/or a wiring structure (not shown separately) provided (or formed) in a portion of the sub-display 210 that overlaps at least in part with the first camera module 205 may reduce a light loss between the first camera module 205 and the outside. According to an embodiment of the disclosure, pixels need not be disposed in a portion of the sub-display 210 that overlaps at least in part with the first camera module 205.

The plurality of second camera modules 206 may have different properties (e.g., angle of view) or functions and may include, for example, a dual camera or a triple camera. The plurality of second camera modules 206 may include a plurality of camera modules having lenses with different angles of view, and the electronic device 1 may be configured to change, in response to a user's selection, the angle of view of the camera module running in the electronic device 1. The plurality of second camera modules 206 may include at least one of a wide-angle camera, a telephoto camera, a color camera, a monochrome camera, or an infrared (IR) camera (e.g., a time-of-flight (TOF) camera, a structured light camera). In some embodiments, the IR camera may be operated as at least part of a sensor module. The electronic device 1 may include a flash 207 as a light source for the plurality of second camera modules 206. The flash 207 may include, for example, a light emitting diode or a xenon lamp.

The sensor module may generate an electrical signal or data value corresponding to an internal operating state of the electronic device 1 or an external environmental state. The sensor module may include, for example, at least one of a proximity sensor, a gesture sensor, a gyro sensor, a barometric pressure sensor, a magnetic sensor, an acceleration sensor, a grip sensor, a color sensor, an infrared (IR) sensor, a biometric sensor (e.g., a fingerprint sensor, an heart rate monitor (HRM) sensor), a temperature sensor, a humidity sensor, and an illuminance sensor.

The sensor module may include an optical sensor 208 positioned inside the electronic device 1 corresponding to the fourth cover area ⓓ. The optical sensor 208 may include, for example, a proximity sensor or an illuminance sensor. The optical sensor 208 may be aligned with an opening provided (or formed) in the sub-display 210. External light may pass through the openings of the second rear cover 121 and the sub-display 210 and reach the optical sensor 208 According to an embodiment of the disclosure, the optical sensor 208 may be located on the rear surface of the sub-display 210 or below or beneath the sub-display 210, and the optical sensor 208 may perform a related function without visually distinguishing (or exposing) its position. According to another embodiment of the disclosure, the optical sensor 208 may be aligned and positioned in a recess provided (or formed) in the rear surface of the sub-display 210.

The optical sensor 208 may be disposed to overlap with at least a portion of the screen and may perform a sensing function without being visually exposed to the outside. In this case, a portion of the sub-display 210 that overlaps at least in part with the optical sensor 208 may include a pixel structure and/or a wiring structure (not shown separately) different from the other portion. For example, a portion of the sub-display 210 that overlaps at least in part with the optical sensor 208 may have a different pixel density compared to the other portion (not shown separately).

The sensor module may include a fingerprint sensor (not shown) located below the sub-display 210. The fingerprint sensor may be implemented with a capacitive scheme, an optical scheme, or an ultrasonic scheme. A pixel structure and/or a wiring structure provided (or formed) in a portion of the sub-display 210 that overlaps at least in part with the sensor module may reduce a light loss when various types of signals (e.g., light or ultrasonic waves) related to the sensor module pass between the sensor module and the outside. Pixels need not be disposed in a portion of the sub-display 210 that overlaps at least in part with the sensor module.

The connection terminal may include, for example, a connector (e.g., a USB connector) located inside the electronic device 1. The electronic device 1 may include a connector hole 209 provided (or formed) in the first side surface 10C corresponding to the connector. The electronic device 1 may transmit and/or receive power and/or data with an external electronic device electrically connected to the connector through the connector hole 209. The position or number of the connector and the corresponding connector hole 209 is not limited to the illustrated example and may vary.

According to an embodiment of the disclosure, the electronic device 1 may include a detachable pen input device (e.g., an electronic pen, a digital pen, or a stylus pen) (not shown separately). The pen input device may be detachably attached to the hinge housing 30. The hinge housing 40 may include a recess, and the pen input device may be fitted in the recess. The pen input device may be detachably attached to the recess of the hinge housing 30 exposed to the outside, for example, in the folded state (see FIG. 2) or the intermediate state of the electronic device 1. The electronic device 1 may be implemented such that the pen input device can be inserted into the inner space of the first housing 11 or the second housing 12.

Figure 3:
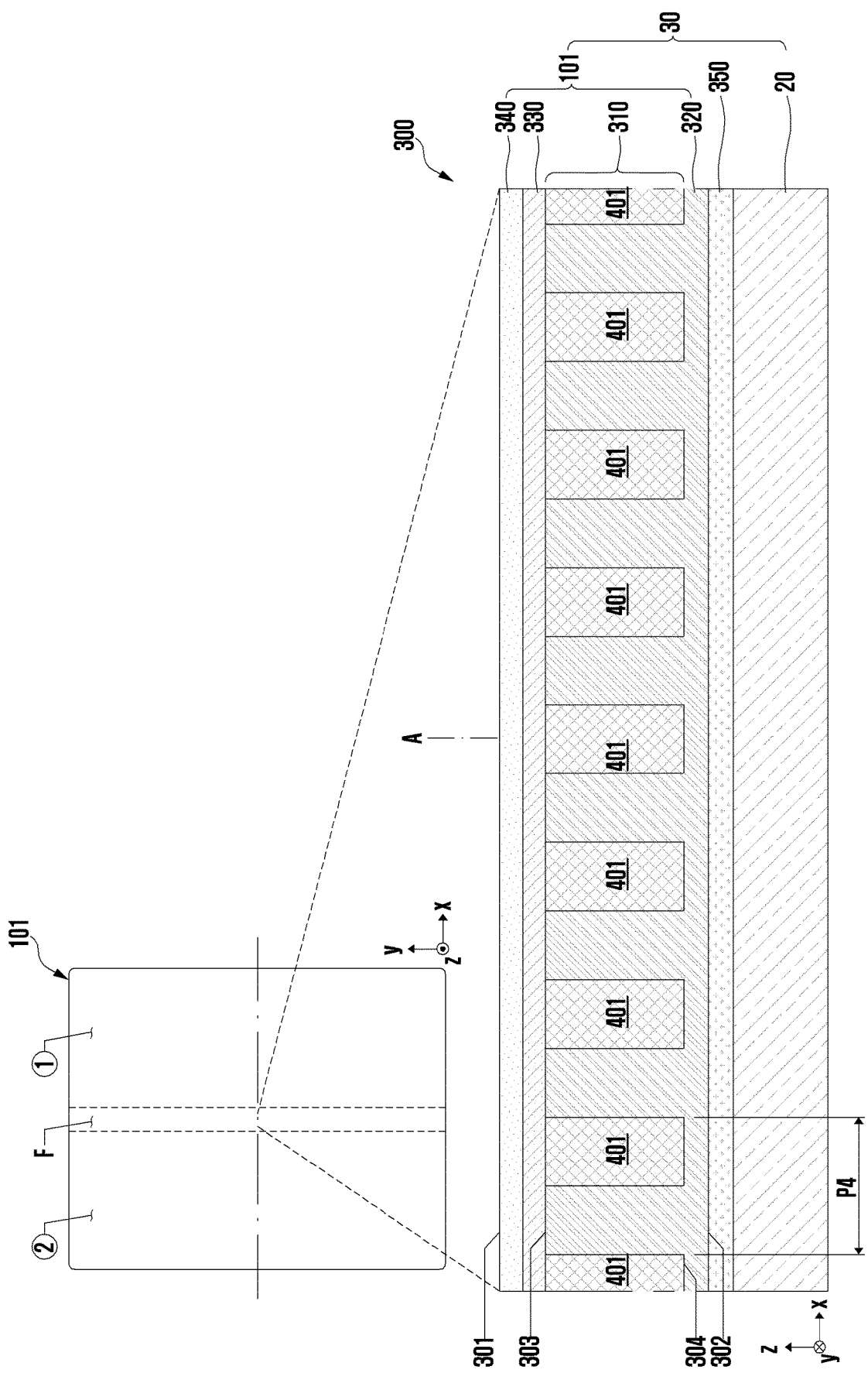
FIG. 3 is a cross-sectional view of a display assembly included in the electronic device taken along line C-C' in FIG. 1, according to an embodiment of the disclosure.

FIG. 3 is a cross-sectional view 300 (e.g., a cross-sectional view or structure in the x-z plane) of a display assembly 30 included in the electronic device 1 taken along line C-C' in FIG. 1, according to an embodiment of the disclosure.

Figure 4:
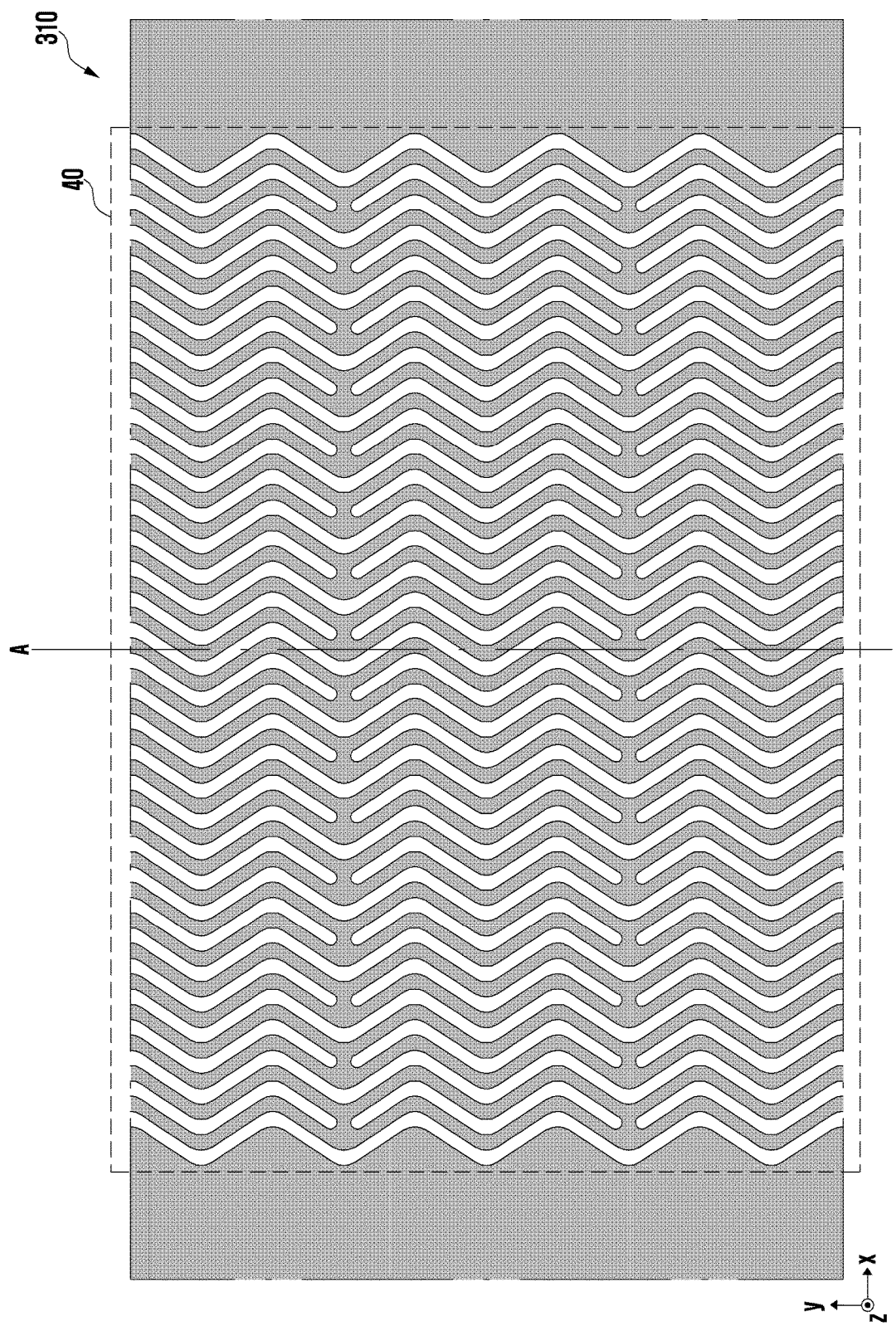
FIG. 4 is a diagram illustrating a first layer included in a front cover of an electronic device in an unfolded state, according to an embodiment of the disclosure.

FIG. 4 is a diagram (e.g., the x-y plan view) illustrating a first layer 310 included in a front cover 101 of an electronic device 1 in an unfolded state (see FIG. 1), according to an embodiment of the disclosure.

Figure 5:
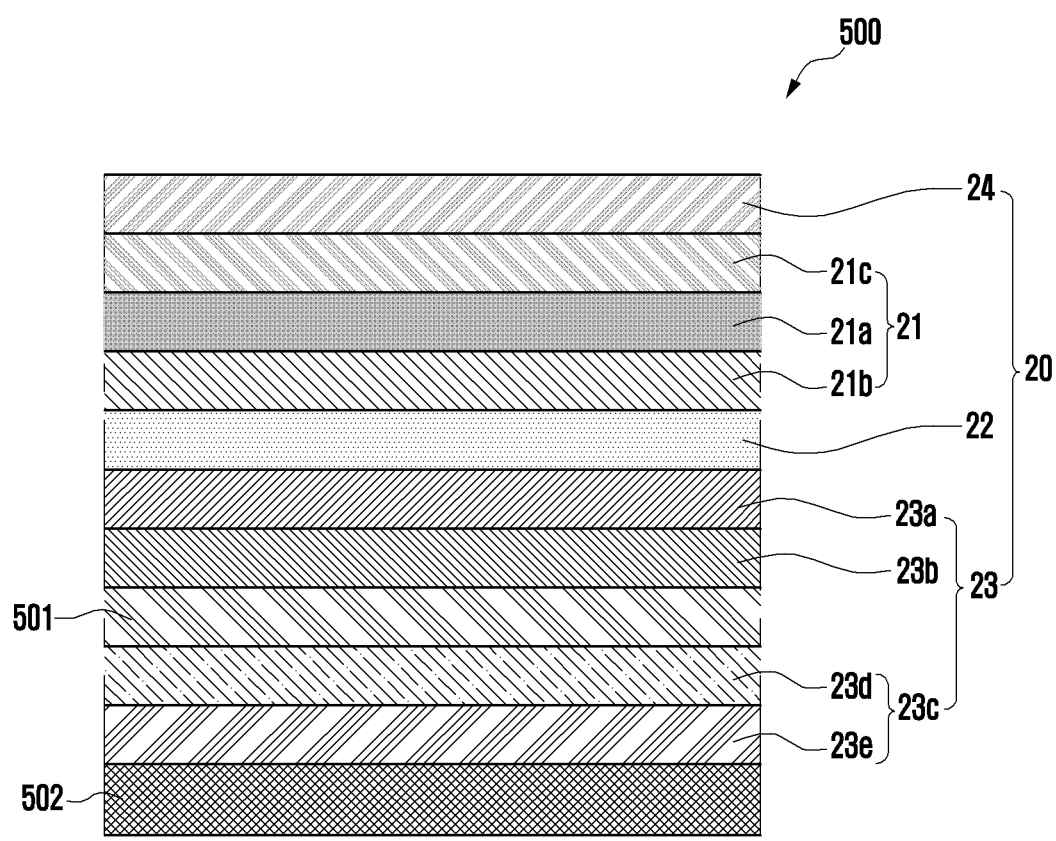
FIG. 5 is a cross-sectional view of a flexible display included in the display assembly of FIG. 4, according to an embodiment of the disclosure.

FIG. 5 is a cross-sectional view of a flexible display included in the display assembly of FIG. 4, according to an embodiment of the disclosure.

Figure 6:
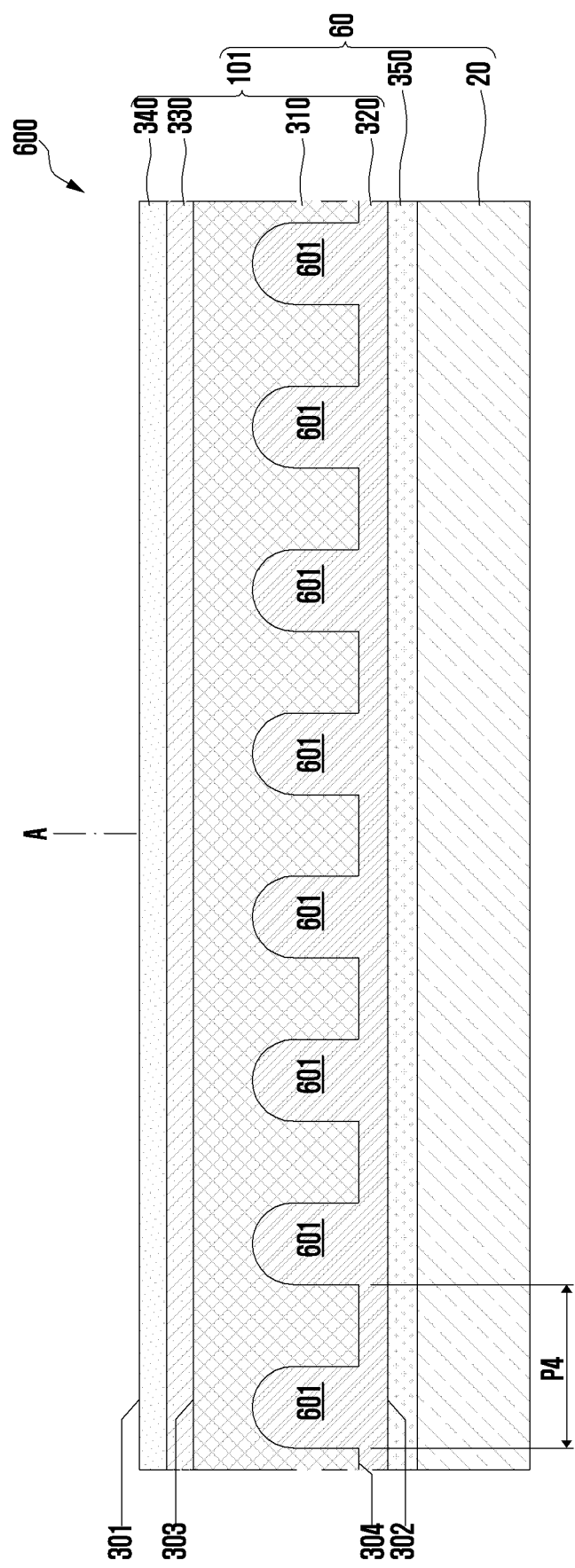
FIG. 6 is a cross-sectional view of a display assembly included in the electronic device taken along line C-C' in FIG. 1, according to an embodiment of the disclosure.

FIG. 6 is a cross-sectional view 600 (e.g., a cross-sectional view or structure in the x-z plane) of a display assembly 60 included in the electronic device 1 taken along line C-C' in FIG. 1, according to an embodiment of the disclosure.

Referring to FIGS. 3 and 4, the display assembly 30 may include a front cover 101, a flexible display 20, and an optically transparent adhesive member 350 between the front cover 101 and the flexible display 20. The front cover 101 and the flexible display 20 may be combined using the optically transparent adhesive member 350. The optically transparent adhesive member 350 may include, for example, optical clear adhesive (OCA), optical clear resin (OCR), or super view resin (SVR). The front cover 101 and the optically transparent adhesive member 350 may be substantially transparent, and the light outputted from the flexible display 20 may pass through the optically transparent adhesive member 350 and the front cover 101 to the outside. The flexible display 20 may have a first display area corresponding to the first cover area ⓐ of the front cover 101, a second display area corresponding to the second cover area ⓑ of the front cover 101, and a third display area (or a folding display area) corresponding to the folding cover area F of the front cover 101. The cross-sectional view 300 illustrated in FIG. 3 may correspond to a portion of the display assembly 30 corresponding to the folding cover area F of the front cover 101.

The front cover 101 may have a first surface 301 and a second surface 302 positioned opposite to the first surface 301. The first surface 301 may provide (or form) the front surface 10A (see FIG. 1) of the electronic device 1. The first surface 301 and the second surface 302 may be substantially parallel, and the thickness of the front cover 101 (e.g., the distance between the first surface 301 and the second surface 302) may be provided (or formed) to be substantially the same in the first cover area ⓐ, the second cover area ⓑ, and the folding cover area F.

The front cover 101 may include a first layer 310, a second layer 320, a third layer 330, and/or a fourth layer 340. The first layer 310 and the second layer 320 may be positioned between the third layer 330 and the optically transparent adhesive member 350. The third layer 330 may be positioned between the fourth layer 340 and the optically transparent adhesive member 350 to be closer to the fourth layer 340 than the first layer 310.

The first layer 310 may be, for example, a transparent plate including glass or plastic (e.g., polyimide). The first layer 310 may include a glass plate (e.g., thin glass or ultrathin glass) formed (or made) of an element such as selenium or sulfur, an oxide such as silicon, boron, or germanium, or an inorganic material such as an oxide salt, sulfide, selenide, or halide. For example, the glass may include a basic network form material, or may further include an auxiliary material chemically bonded thereto to have properties such as mechanical strength, chemical durability, transparency, or electrical insulation. The first layer 310 may be formed through a process of forming a thin glass and a process of strengthening the thin glass. The thin glass may have, but is not limited to, a thickness of, for example, about 30 micrometer (μm) to about 1000 μm. The process of reinforcing the thin-film glass may include, for example, injecting a special material to the thin glass to a certain depth or more. The first layer 310 may have a natural smooth feel of the glass or uniformity of the surface. The first layer 310 containing glass may have a higher hardness than a plastic film (e.g., a polyimide film). When the first layer 310 containing glass provides (or forms) the front surface 10A (see FIG. 1) of the electronic device 1 (e.g., when the third layer 330 and the fourth layer 340 are omitted), the first layer 310 may have excellent resistance to scratches compared to a plastic film (e.g., a polyimide film).

According to an embodiment of the disclosure, the first layer 310 may include glass having various optical properties. For example, the first layer 310 may be implemented to pass or not pass light of a specific wavelength band such as ultraviolet rays or infrared rays.

According to an embodiment of the disclosure, the first layer 310 may include glass having a relatively low dielectric constant in order to prevent energy loss to the glass. For example, the first layer 310 may include glass having a relatively low dielectric loss. This can reduce performance degradation of at least one component (e.g., an electromagnetic induction panel, a touch sensing circuit, or an antenna) that forms an electric or magnetic field toward the first surface 301. If there are sodium ions in the glass, charges may be transported (e.g., ion conduction) under the action of an electric field, so the first layer 310 may include glass having a low content of alkali such as sodium.

The first layer 310 may have, for example, a third surface 303 facing the first surface 301 of the front cover 101, and a fourth surface 304 facing the second surface 302 of the front cover 101. The third surface 303 and the fourth surface 304 may be substantially parallel. The first layer 310 may be provided (or formed) to have a thickness (e.g., a separation distance between the third surface 303 and the fourth surface 304) of contributing so that bending stress does not substantially reach the yield stress in the folded state (see FIG. 2) of the electronic device 1. A portion of the first layer 310 corresponding to the folding cover area F of the front cover 101 may be implemented to have a relatively thin thickness compared to the first cover area ⓐ and/or the second cover area ⓑ of the front cover 101.

As shown in FIG. 4, the first layer 310 may include a fourth pattern (or fourth pattern structure) 40 provided (or formed) corresponding to the folding cover area F of the front cover 101. The fourth pattern 40 of the first layer 310 may include, for example, a lattice structure having a plurality of openings (or slits) 401 penetrating between the third surface 303 and the fourth surface 304. The plurality of openings 401 included in the lattice structure may be periodically provided (or formed) and repeatedly arranged at regular intervals while having substantially the same shape. The plurality of openings 401 may have a series of corrugated shapes. According to embodiments of the disclosure, the plurality of openings 401 may be provided (or formed) in a shape including a series of sinuous curves, bends, loops, turns, or windings. The shape of the plurality of openings 401 included in the lattice structure may be various.

The lattice structure including the plurality of openings 401 may be referred to as other terms such as an 'opening pattern', a 'hole pattern', or a 'lattice pattern'. The fourth pattern 40 of the first layer 310 may contribute to flexibility of the folding cover area F and a corresponding portion of the display assembly 30. Referring to the cross-sectional view 600 of FIG. 6, the fourth pattern 40 of the first layer 310 may be transformed into a recess pattern (not shown) having a plurality of recesses 601. For example, the plurality of recesses 601 may refer to (or may be defined or interpreted as) recesses provided (or formed) in the fourth surface 304. A first portion of the first layer 310 including the plurality of recesses 601 may have a first thickness with respect to the third surface 303, and a second portion of the first layer 310 not including the plurality of recesses may have a second thickness greater than the first thickness with respect to the third surface 303.

The fourth pattern 40 provided (or formed) in the lattice structure including the plurality of openings 401 or the recess pattern including the plurality of recesses 601 may extend to the first cover area ⓐ or the second cover area ⓑ of the front cover 101. The plurality of openings 401 or the plurality of recesses 601 included in the fourth pattern 40 of the first layer 310 may be formed using various techniques such as laser, computer numerical control (CNC) machining, scratching, blasting, polishing, or etching (e.g., chemical etching).

According to an embodiment of the disclosure, the second layer 320 may be combined with the first layer 310. The second layer 320 may include a substantially transparent polymer. Of the front cover 101, a smooth second surface 302 for bonding with the flexible display 20 may be provided (or formed) by the second layer 320, and the second layer 320 may include a portion disposed (e.g., filled) in the plurality of openings 401 (or the plurality of recesses 601 shown in FIG. 6) of the first layer 310. Compared to the structure in which the third layer 330 is disposed on the first layer 310 as shown in FIG. 6, the third layer 330 as shown in FIG. 3 may be disposed on one surface provided (or formed) by the first layer 310 and a portion of the second layer 320 located in the plurality of openings 401.

The second layer 320 may reinforce the first layer 310. Impact resistance or durability of the first layer 310 may be reinforced by the second layer 320. The second layer 320 may relieve bending stress occurring in a bent area (or bendable area) of the first layer 310 corresponding to the folding cover area F of the front cover 101 in the folded state (see FIG. 2) of the electronic device 1. Because the bending stress occurring in the first layer 310 due to a repeated change between the unfolded state and the folded state of the electronic device 1 may cause a decrease or loss of elastic force due to fatigue accumulation and thereby result in breakage, the second layer 320 may relieve the bending stress generated in the first layer 310.

The second layer 320 have a shape and/or physical properties (e.g., hardness or ductility) such that the flexibility of the folding cover area F of the front cover 101 does not decrease below a specified level. The specified level of flexibility may be a value that allows the display assembly 30 or 60 to be smoothly deformed in a state change of the electronic device 1 (e.g., transition between the unfolded state and the folded state) while substantially not causing breakage or permanent deformation thereof. For example, when the electronic device 1 is changed from the folded state to the unfolded state, the second layer 320 may have an elasticity that contributes so that the front cover 101 can be restored substantially without plastic deformation. The second layer 320 may have, for example, an elongation of about 4% to about 20%.

The folding cover area F of the front cover 101 has the plurality of openings 401 (or the plurality of recesses 601 as shown in FIG. 6) compared to the first cover area ⓐ and the second cover area ⓑ, so the folding cover area F may be relatively vulnerable to external impacts or external pressures. For example, when a user input is made by bringing a pen tip of the pen input device into contact with the first surface 101 of the front cover 101, the folding cover area F of the front cover 101 has a risk of being damaged by an external impact or external pressure applied from the pen tip compared to the first cover area ⓐ and the second cover area ⓑ. The second layer 320 may reduce damage to the first layer 310 from an external impact or external pressure applied to the first layer 310. The second layer 320 may relieve stress that may occur in the first layer 310 due to an external impact or external pressure. The second layer 320 may have a hardness that can reduce damage to the folding cover area F of the front cover 101 in response to an external impact or external pressure. The hardness of the second layer 320 may provide resistance to local plastic deformation of the folding cover area F due to an external impact or external pressure, thereby reducing damage to the folding cover area F.

The second layer 320 may include an acryl-based, urethane-based, or silicone-based organic material.

The second layer 320 may be formed using an ultraviolet rays (UV) molding liquid (e.g., a photo-curable material). The first layer 310 may be placed on a mold (e.g., a mold for UV molding) into which the UV molding liquid is injected, and then compressed with a roller, whereby the UV molding liquid may be spread evenly between the first layer 310 and the mold. In some embodiments, the first layer 310 may be applied with a primer using a process such as vacuum deposition or spattering, then placed on a mold in which the UV molding liquid is injected, and compressed. In this case, there may be a bonding layer (not shown) including a primer between the first layer 310 and the second layer 320. The bonding layer including the primer may improve bonding strength while allowing the first layer 310 and the second layer 320 to be tightly bonded. When UV (or light of a specified frequency) is irradiated toward the first layer 310, the UV molding liquid may be cured in response to UV transmitted through the first layer 310, and resultantly a sheet having a form in which the second layer 320 is attached to the first layer 310 may be formed.

The third layer 330 may reinforce the display assembly 30 or 60 or the first layer 310. The third layer 330 may include a substantially transparent polymer. In the embodiment of FIG. 3, using an optically transparent adhesive member (not shown) such as OCA, OCR, or SVR, the third layer 330 may be disposed on one surface provided (or formed) by the first layer 310 and a portion of the second layer 320 located in the plurality of openings 401. In the embodiment of FIG. 6, the third layer 330 may be disposed on the first layer 310 using an optically transparent adhesive member (not shown). The third layer 330 may have a shape (e.g., thickness) and/or physical properties (e.g., hardness or ductility) such that the flexibility of the folding cover area F of the front cover 101 does not decrease below a specified level. When the electronic device 1 is changed from the folded state to the unfolded state, the third layer 330 may have an elasticity contributing to the restoration of the front cover 101 without substantially plastic deformation.

The fourth layer 340 may be disposed on the third layer 330 and provide (or form) the first surface 301 of the front cover 101. The fourth layer 340 may be disposed on the third layer 330 using an optically transparent adhesive member (not shown) such as OCA, OCR, or SVR. The fourth layer 340 may be, for example, as a transparent coating layer, a final layer for neatly protecting the front cover 101 from the outside. The transparent coating layer may include a clear layer, such as a UV clear layer formed (or made) of a UV curable material. The fourth layer 340 may have resistance to external impacts (or scratches). The fourth layer 340 may have a shape (e.g., thickness) and/or physical properties (e.g., hardness or ductility) such that the flexibility of the folding cover area F of the front cover 101 does not decrease below a specified level. When the electronic device 1 is changed from the folded state to the unfolded state, the fourth layer 330 may have an elasticity contributing to the restoration of the front cover 101 without substantially plastic deformation. According to an embodiment of the disclosure, the third layer 330 may include an optical adhesive member.

Although not shown, it is possible to further add a layer having various functions and disposed on the fourth layer 340 to provide (or form) the front surface 10A of the electronic device 1.

When the first layer 310 is implemented to substantially provide (or form) the front surface 10A of the electronic device 1, the third layer 330 and the fourth layer 340 may be omitted in the embodiment of FIG. 6.

Among a plurality of layers (e.g., the first layer 310, the second layer 320, the third layer 330, the fourth layer 340, or an optically transparent member between any two layers)

included in the front cover 101, two layers bonded to each other may be implemented to include a material capable of reducing a difference in refractive index therebetween. For example, reducing the difference in refractive index between two layers may reduce the reflectance of an interface between the two layers and thereby reduce reflection at the interface and loss of light, so that a clearer image can be seen through the screen. The difference in refractive index between two layers may be, for example, about 0.01 or less, which corresponds to a level for showing a clear image.

Among a plurality of layers (e.g., the first layer 310, the second layer 320, the third layer 330, the fourth layer 340, or an optically transparent member between any two layers) included in the front cover 101, two layers bonded to each other may be bonded substantially without an air gap. For example, because the air gap may cause loss of light from the flexible display 20 and thereby cause image quality degradation, the second layer 320, the third layer 330, or the fourth layer 340 may be formed by applying a liquid material and then curing it, thereby reducing the occurrence of an air gap.

The optically transparent adhesive member 350 may include a material capable of reducing a refractive index difference with the front cover 101 and a refractive index difference with the flexible display 20.

Referring to FIG. 5, the flexible display 20 may include a display panel 21, a base film 22, a lower panel 23, and/or an optical layer 24. The display panel 21 may be positioned between the optical layer 24 and the base film 22. The base film 22 may be positioned between the display panel 21 and the lower panel 23. The optical layer 24 may be positioned between the optically transparent adhesive member 350 and the display panel 21. An adhesive member (not shown) of various polymers may be disposed between the display panel 21 and the base film 22, between the base film 22 and the lower panel 23, and/or between the display panel 21 and the optical layer 24.

The display panel 21 may include, for example, a light emitting layer 21a, a thin film transistor (TFT) film 21b, and/or an encapsulation layer (e.g., thin-film encapsulation (TFE)) 21c. The light emitting layer 21a may have, for example, a plurality of pixels implemented as light emitting devices such as OLEDs or micro LEDs. The light emitting layer 21a may be disposed on the TFT film 21b through organic material evaporation. The TFT film 21b may be positioned between the light emitting layer 21a and the base film 22. The TFT film 21b may be a film structure (or film) in which at least one TFT is disposed on a flexible substrate (e.g., a PI film) through a series of processes such as deposition, patterning, and etching. The at least one TFT may control a current to the light emitting device of the light emitting layer 21a to turn on or off the pixel or adjust the brightness of the pixel. The at least one TFT may be implemented as, for example, an amorphous silicon (a-Si) TFT, a liquid crystalline polymer (LCP) TFT, a low-temperature polycrystalline oxide (LTPO) TFT, or a low-temperature polycrystalline silicon (LTPS) TFT.

The display panel 21 may include a storage capacitor, and the storage capacitor may maintain a voltage signal in the pixel, maintain a voltage applied to the pixel within one frame, or reduce a change in a gate voltage of the TFT due to a leakage current during a light emission time. By a routine (e.g., initialization, data write) controlling the at least one TFT, the storage capacitor may maintain the voltage applied to the pixel at a predetermined time interval. According to an embodiment of the disclosure, the display panel 21 may be implemented based on an OLED, and the encapsulation layer 21c may cover the light emitting layer 21a. Because organic materials and electrodes that emit light in OLEDs may react very sensitively to oxygen and/or moisture and thereby lose their luminescent properties, the encapsulation layer 21c may encapsulate the light emitting layer 21a to prevent oxygen and/or moisture from penetrating into the OLED. The encapsulation layer 21c may serve as a pixel protection layer for protecting the plurality of pixels of the light emitting layer 21a.

The base film 22 may include a flexible film formed (or made) of a polymer or plastic such as polyimide or polyester (PET). The base film 22 may serve to support and protect the display panel 21. The base film 22 may be referred to as a 'protective film', a 'back film', or a 'back plate'.

The lower panel 23 may include a plurality of layers for various functions. An adhesive member (not shown) of various polymers may be disposed between the plurality of layers included in the lower panel 23. The lower panel 23 may include, for example, a light blocking layer 23a, a buffer layer 23b, or a lower layer 23c. The light blocking layer 23a may be positioned between the base film 22 and the buffer layer 23b. The buffer layer 23b may be positioned between the light blocking layer 23a and the lower layer 23c. The light blocking layer 23a may block at least in part light incident from the outside. For example, the light blocking layer 23a may include an embossed layer. The embossed layer may be a black layer having an uneven pattern. The buffer layer 23b may mitigate an external impact applied to the flexible display 20. For example, the buffer layer 23b may include a sponge layer or a cushion layer. The lower layer 23c may diffuse, disperse, or dissipate heat generated in the electronic device 1 or the flexible display 20. The lower layer 23c may absorb or shield electromagnetic waves. The lower layer 23c may mitigate an external impact applied to the electronic device 1 or the flexible display 20. For example, the lower layer 23c may include a composite sheet 23d or a conductive sheet 23e.

The composite sheet 23d may be a sheet processed by combining layers or sheets having different properties. For example, the composite sheet 23d may include at least one of polyimide and graphite. The composite sheet 23d may be replaced with a single sheet including one material (e.g., polyimide or graphite). The composite sheet 23d may be positioned between the buffer layer 23b and the conductive sheet 23e. The conductive sheet 23e may reduce or shield electromagnetic interference (EMI) to the flexible display 20. The conductive sheet 23e may include, but is not limited to, copper or various other metal materials.

At least a portion of the lower layer 23c may be a conductive member (e.g., a metal plate), which may help to reinforce the rigidity of the electronic device 1, shield ambient noise, and dissipate heat emitted from surrounding heat-generating components (e.g., a display driving circuit (e.g., DDI)). The conductive member may include, for example, at least one of copper (Cu), aluminum (Al), stainless steel (SUS), or CLAD (e.g., a stacked member in which SUS and Al are alternately disposed). The lower layer 23c may include various layers for various other functions. According to an embodiment of the disclosure (not shown), at least one additional polymer layer (e.g., a layer including PI, PET, or TPU) in addition to the base film 22 may be further disposed on the rear surface of the display panel 21. At least one of the plurality of layers (e.g., the light blocking layer 23a, the buffer layer 23b, the composite sheet 23d, and the conductive sheet 23e) included in the lower panel 23 may be omitted. The arrangement order of the plurality of layers included in the lower panel 23 is not limited to the illustrated example and may be variously changed.

The optical layer 24 may include, for example, a polarizing layer (or polarizer), or a retardation layer (or retarder). The polarizing layer and the retardation layer may improve the outdoor visibility of the screen. For example, the optical layer 24 may selectively transmit light that is generated from a light source of the display panel 21 and vibrates in a certain direction. According to an embodiment of the disclosure, a single layer in which the polarizing layer and the retardation layer are combined may be provided, and this layer may be defined or interpreted as a 'circular polarization layer'. According to an embodiment of the disclosure, the polarizing layer (or circular polarization layer) may be omitted, and in this case, a black pixel define layer (PDL) and/or color filter may be included in place of the polarizing layer.

The flexible display 20 may include a touch sensing circuit (e.g., a touch sensor) (not shown). The touch sensing circuit may be implemented as a transparent conductive layer (or film) based on various conductive materials such as indium tin oxide (ITO). For example, the touch sensing circuit may be disposed between the front cover 101 and the optical layer 24 (e.g., add-on type). In another example, the touch sensing circuit may be disposed between the optical layer 24 and the display panel 21 (e.g., on-cell type). The display panel 21 may include a touch sensing circuit or a touch sensing function (e.g., in-cell type). According to an embodiment of the disclosure (not shown), the flexible display 20 may include a conductive pattern such as a metal mesh (e.g., aluminum mesh) as a touch sensing circuit disposed on the encapsulation layer 21c between the encapsulation layer 21c and the optical layer 24. For example, in response to bending of the flexible display 20, the metal mesh may have greater durability than a transparent conductive layer implemented with ITO.

The flexible display 20 may further include a pressure sensor (not shown) capable of measuring the intensity (pressure) of a touch. A plurality of layers included in the display panel 21 or the lower panel 23, a stacking structure thereof, or a stacking order may vary. The flexible display 20 may be implemented by omitting some of the above components or adding other components according to its provision form or convergence trend. An electromagnetic induction panel (e.g., a digitizer) 501 may be positioned between the buffer layer 23b and the lower layer 23c. The electromagnetic induction panel 501 may be positioned between the composite sheet 23d and the conductive sheet 23e of the lower layer 23c. Alternatively, the electromagnetic induction panel 501 may be positioned between the light blocking layer 23a and the buffer layer 23b. The electromagnetic induction panel 501 may be implemented in a form such as a flexible film or a flexible sheet. The electromagnetic induction panel 501 may be provided (or formed) as, for example, a flexible printed circuit board. When alternating current is supplied to the electromagnetic induction panel 501, an electromagnetic field may be formed by a plurality of electrode patterns included in the electromagnetic induction panel 501.

The pen input device may be implemented with an electromagnetic induction scheme (e.g., an electro-magnetic resonance (EMR) scheme). The pen input device may include a resonance circuit, and the resonance circuit may be interlocked with the electromagnetic induction panel 501. When the pen tip of the pen input device is brought close to the front surface 10A of the electronic device 1, a current may flow through the coil included in the resonance circuit of the pen input device by electromagnetic induction. The pen input device generates a signal (e.g., a radio frequency signal) (e.g., a position signal, a pen pressure signal, and/or an angle signal) related to a user input on the screen by using the energy supplied from the electromagnetic induction panel 501 and transmit the signal to the screen (e.g., the electromagnetic induction panel 501).

The electromagnetic induction panel 501 may include a shielding sheet. The shielding sheet may be positioned on the rear surface (e.g., a surface of the flexible printed circuit board facing the conductive sheet 23e in the illustrated embodiment) of the flexible printed circuit board including the plurality of electrode patterns. The shielding sheet may prevent the components included in the electronic device 1 from interfering with each other by an electromagnetic field generated from the components. The shielding sheet blocks the electromagnetic field generated from the components, so that an input from the pen input device can be accurately transmitted to the coil included in the electromagnetic induction panel 501. The electromagnetic induction panel 501 may be defined or interpreted as a component included in the flexible display 20. The pen input device may be implemented with an active electrical stylus (AES) scheme or an electric coupled resonance (ECR) scheme. In this case, the electromagnetic induction panel 501 may be omitted.

A support sheet 502 may be disposed on the rear surface of the flexible display 20. For example, the support sheet 502 may be disposed on the rear surface of the lower panel 23 included in the flexible display 20. The support sheet 502 may contribute to durability of the display assembly 30 or the flexible display 20. For example, the support sheet 502 may reduce the effect of a load or stress that may occur in a change between the unfolded state (see FIG. 1) and the folded state (see FIG. 2) of the electronic device 1 on the flexible display 20. The support sheet 502 may be formed (or made) of various metallic and/or non-metallic materials (e.g., polymers). The support sheet 502 may include, for example, stainless steel. In another example, the support sheet 502 may include an engineering plastic. In some embodiments, the support sheet 502 may be implemented integrally with the flexible display 20.

The support sheet 502 may include a lattice structure (not shown separately) provided (or formed) in a portion corresponding to the folding cover area F of the front cover 101. The lattice structure may have, for example, a plurality of openings (or slits). The plurality of openings may be periodically provided (or formed) and repeatedly arranged at regular intervals while having substantially the same shape. The lattice structure including the plurality of openings may be referred to as an 'opening pattern'. The lattice structure may contribute to flexibility for a portion of the display assembly 30 corresponding to the folding cover area F. The support sheet 502 may include a recess pattern (not shown) having a plurality of recesses, replacing the lattice structure. The lattice structure or recess pattern contributing to the flexibility of the flexible display 20 may be further extended to the other portion. The support sheet 502 including the lattice structure or recess pattern, or a corresponding conductive member, may be provided (or formed) as a plurality of layers. In some embodiments, the support sheet 502 may be omitted or may be defined or interpreted as a component included in the flexible display 20.

The fourth pattern 40 of the first layer 310 included in the front cover 101 may have the plurality of openings 401 (see FIG. 3) or the plurality of recesses 601 (see FIG. 6) arranged based on a fourth pitch (or fourth interval) P4. The fourth pitch P4 may indicate (or may be defined or interpreted as) an interval at which the openings or recesses having a substantially constant shape are periodically and repeatedly arranged. With reference to FIG. 3 in which the display assembly 30 is in the unfolded state, the plurality of openings 401 may be arranged based on the fourth pitch P4 in a direction (e.g., in the x-axis direction) substantially perpendicular to the folding axis A. With reference to FIG. 6 in which the display assembly 30 is in the unfolded state, the plurality of recesses 601 may be arranged based on the fourth pitch P4 in a direction (e.g., in the x-axis direction) substantially perpendicular to the folding axis A.

The fourth pattern 40 of the first layer 310 is not limited to the illustrated example and may vary. For example, the fourth pattern 40 may be modified to have a first sub-pattern in which first openings or first recesses of a first shape are arranged at a pitch of a first value in a first direction, and a second sub-pattern in which second openings or second recesses different from the first shape are arranged at a pitch of the first value or a second value different from the first value in a second direction different from the first direction. In another example, the fourth pattern 40 may be modified in a form in which the same shaped openings or recesses are arranged at the same or different pitches in at least two or more directions (e.g., directions perpendicular to each other). The shape of the fourth pattern 40 may be provided (or formed) in various ways to secure the flexibility of the first layer 310.

The fourth pattern 40 of the first layer 310 may be provided (or formed) to reduce a moire phenomenon when light is outputted from a plurality of sub-pixels included in the display panel 21. The moire phenomenon may be a phenomenon that, when light is outputted from a plurality of sub-pixels included in the display panel 21, the fourth pattern 40 of the first layer 310 causes light interference, and thus a certain pattern (e.g., a moire pattern) is visually recognized. The plurality of sub-pixels may include, for example, a plurality of first sub-pixels outputting light of a first color among three primary colors, a plurality of second sub-pixels outputting light of a second color among three primary colors, and a plurality of third sub-pixels outputting light of a third color among the three primary colors. The plurality of first sub-pixels may provide (or form) a first pattern arranged at a first pitch (or first interval) in substantially the same direction as a direction in which the plurality of openings 401 or the plurality of recesses 601 included in the fourth pattern 40 of the first layer 310 are arranged at the fourth pitch P4. The plurality of second sub-pixels may provide (or form) a second pattern arranged at a second pitch (or second interval) in substantially the same direction as a direction in which the plurality of openings 401 or the plurality of recesses 601 included in the fourth pattern 40 of the first layer 310 are arranged at the fourth pitch P4. The plurality of third sub-pixels may provide (or form) a third pattern arranged at a third pitch (or third interval) in substantially the same direction as a direction in which the plurality of openings 401 or the plurality of recesses 601 included in the fourth pattern 40 of the first layer 310 are arranged at the fourth pitch P4. Based on Fourier transform, a spatial frequency vector provided (or formed) through convolution summation of a fourth spatial frequency vector provided (or formed) due to the fourth pitch P4 of the fourth pattern 40 included in the first layer 310 and a first spatial frequency vector provided (or formed) due to the first pitch of the first pattern for the plurality of first sub-pixels may be located within a visibility circle with respect to approximately 60 cycles/degree corresponding to the limit pitch that can be perceived by a person, and thus the moire phenomenon may not occur substantially. Based on Fourier transform, a spatial frequency vector provided (or formed) through convolution summation of a fourth spatial frequency vector provided (or formed) due to the fourth pitch P4 of the fourth pattern 40 included in the first layer 310 and a second spatial frequency vector provided (or formed) due to the second pitch of the second pattern for the plurality of second sub-pixels may be located within a visibility circle with respect to approximately 60 cycles/degree corresponding to the limit pitch that can be perceived by a person, and thus the moire phenomenon may not occur substantially. Based on Fourier transform, a spatial frequency vector provided (or formed) through convolution summation of a fourth spatial frequency vector provided (or formed) due to the fourth pitch P4 of the fourth pattern 40 included in the first layer 310 and a third spatial frequency vector provided (or formed) due to the third pitch of the third pattern for the plurality of third sub-pixels may be located within a visibility circle with respect to approximately 60 cycles/degree corresponding to the limit pitch that can be perceived by a person, and thus the moire phenomenon may not occur substantially.

Figure 7:
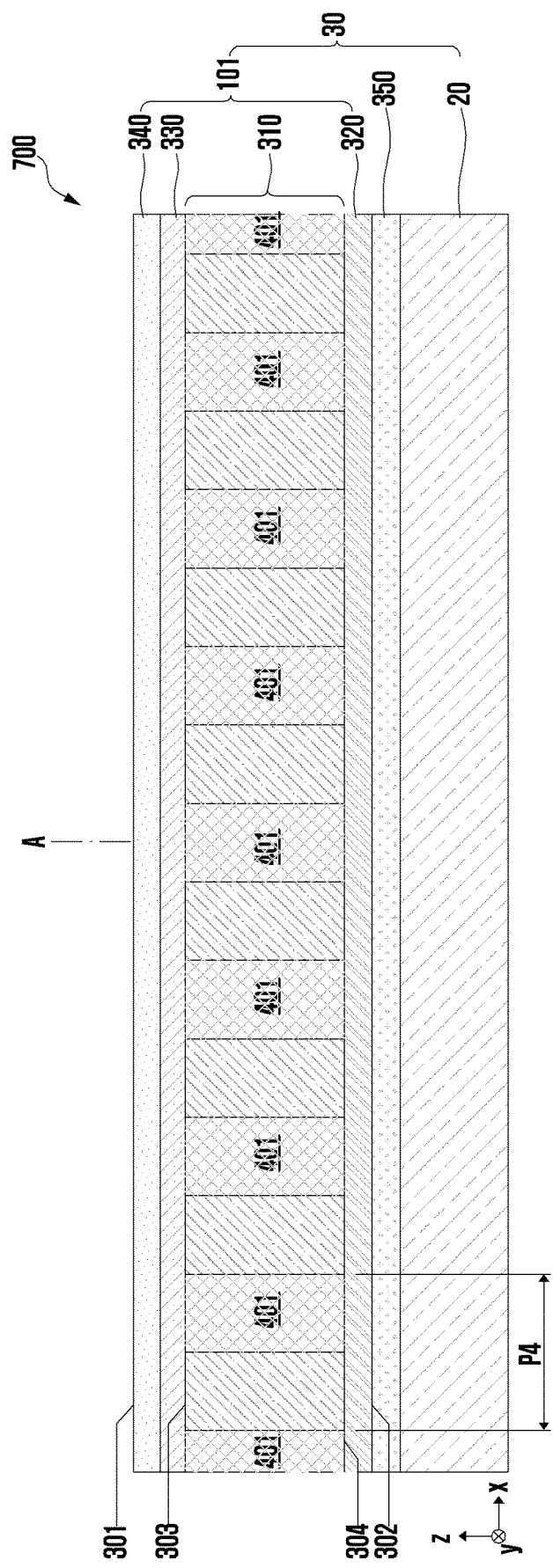
FIG. 7 is a cross-sectional view of a display assembly included in the electronic device taken along line C-C' in FIG. 1, according to an embodiment of the disclosure.

FIG. 7 is a cross-sectional view 700 (e.g., a cross-sectional view or structure in the x-z plane) of a display assembly included in the electronic device 1 taken along line C-C' in FIG. 1, according to an embodiment of the disclosure.

Referring to the cross-sectional view of FIG. 7, compared to the cross-sectional view 300 of FIG. 3, the second layer 320 may not include a portion disposed (e.g., filled) in the plurality of openings 401 of the first layer 310. The display assembly 30 may include a material disposed (e.g., filled) in the plurality of openings 401 of the first layer 310. The material disposed (e.g., filled) in the plurality of openings 401 may be substantially transparent. In the plurality of openings 401, a material (e.g., a flexible polymer material) that does not deteriorate the flexibility of the first layer 310 may be disposed (e.g., filled). The material disposed (e.g., filled) in the plurality of openings 401 may reinforce the first layer 310. Impact resistance or durability of the first layer 310 may be reinforced by the material disposed (e.g., filled) in the plurality of openings 401. The material disposed (e.g., filled) in the plurality of openings 401 may relieve bending stress occurring in a bent area of the first layer 310 corresponding to the folding cover area F of the front cover 101 in the folded state (see FIG. 2) of the electronic device 1. Because the bending stress occurring in the first layer 310 due to a repeated change between the unfolded state and the folded state of the electronic device 1 may cause a decrease or loss of elastic force due to fatigue accumulation and thereby result in breakage, the material disposed (e.g., filled) in the plurality of openings 401 may relieve the bending stress generated in the first layer 310.

The material disposed (e.g., filled) in the plurality of openings 401 of the first layer 310 may be a material capable of reducing light loss by reducing a difference in refractive index with a material included in the first layer 310, a difference in refractive index with the second layer 320, and/or a difference in refractive index with the third layer 330.

the material disposed (e.g., filled) in the plurality of openings 401 may be different from a material included in the second layer 320. In some embodiments, the material disposed (e.g., filled) in the plurality of openings 401 may be the same as a material included in the second layer 320.

According to an embodiment of the disclosure, the second layer 320 may be omitted.

Figure 8:
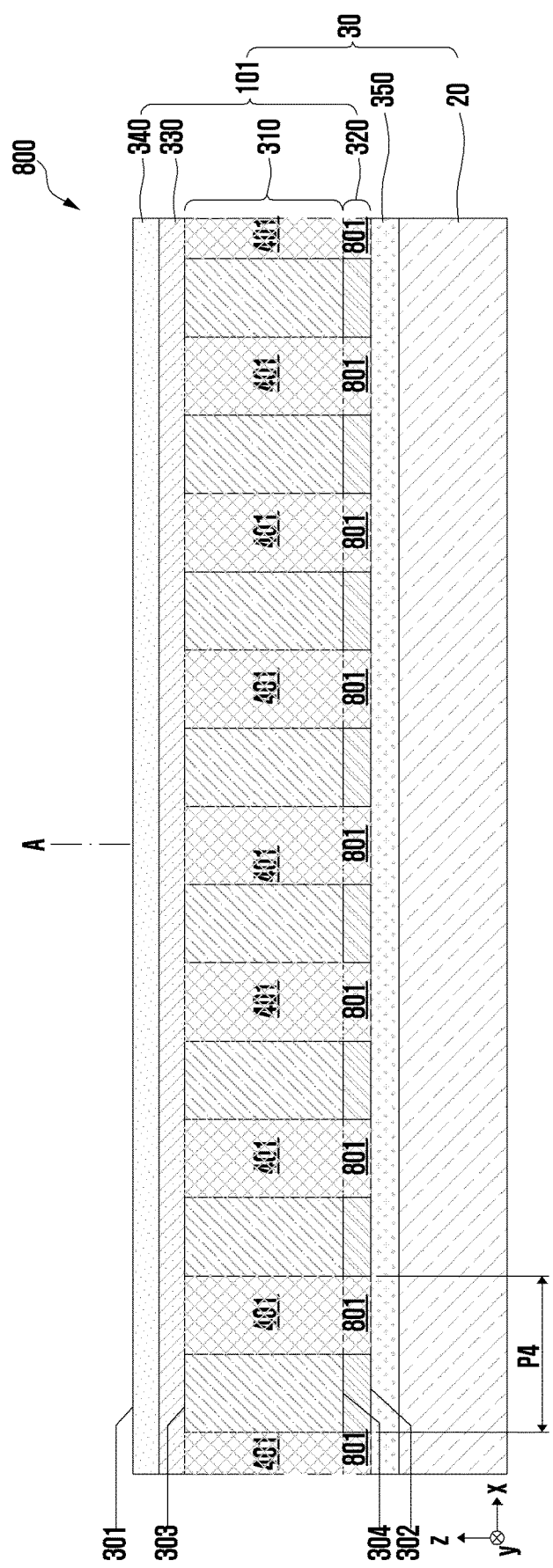
FIG. 8 is a cross-sectional view of a display assembly in which the second layer of the FIG. 7 embodiment is modified, according to an embodiment of the disclosure.

FIG. 8 is a cross-sectional view 800 (e.g., a cross-sectional view or structure in the x-z plane) of a display assembly 30 in which the second layer 320 of the FIG. 7 embodiment is modified, according to an embodiment of the disclosure.

Referring to FIG. 8, the display assembly 30 may include a plurality of openings 401 penetrating between the second surface 302 and the third surface 303. The plurality of openings 401 may include a plurality of first openings provided (or formed) in the first layer 310, and a plurality of second openings 801 provided (or formed) in the second layer 320 to align with the first openings. When viewed from above the first surface 301 in the unfolded state of the display assembly 30, the plurality of first openings in the first layer 310 and the plurality of second openings 801 in the second layer 320 may be overlapped.

The display assembly 30 may include a material disposed (e.g., filled) in the plurality of openings 401. The material disposed (e.g., filled) in the plurality of openings 401 may be substantially transparent. In the plurality of openings 401, a material (e.g., a flexible polymer material) that does not deteriorate the flexibility of the first layer 310 or the display assembly 30 may be disposed (e.g., filled). The material disposed (e.g., filled) in the plurality of openings 401 may reinforce the first layer 310. Impact resistance or durability of the first layer 310 may be reinforced by the material disposed (e.g., filled) in the plurality of openings 401. The material disposed (e.g., filled) in the plurality of openings 401 may relieve bending stress occurring in a bent area of the first layer 310 corresponding to the folding cover area F of the front cover 101 in the folded state (see FIG. 2) of the electronic device 1. Because the bending stress occurring in the first layer 310 due to a repeated change between the unfolded state and the folded state of the electronic device 1 may cause a decrease or loss of elastic force due to fatigue accumulation and thereby result in breakage, the material disposed (e.g., filled) in the plurality of openings 401 may relieve the bending stress generated in the first layer 310.

The material disposed (e.g., filled) in the plurality of openings 401 of the first layer 310 may be a material capable of reducing light loss by reducing a difference in refractive index with a material included in the first layer 310, a difference in refractive index with the second layer 320, a difference in refractive index with the third layer 330, and/or a difference in refractive index with a fifth layer 350.

The material disposed (e.g., filled) in the plurality of openings 401 may be different from a material included in the second layer 320. In some embodiments, the material disposed (e.g., filled) in the plurality of openings 401 may be the same as a material included in the second layer 320.

Figure 9:
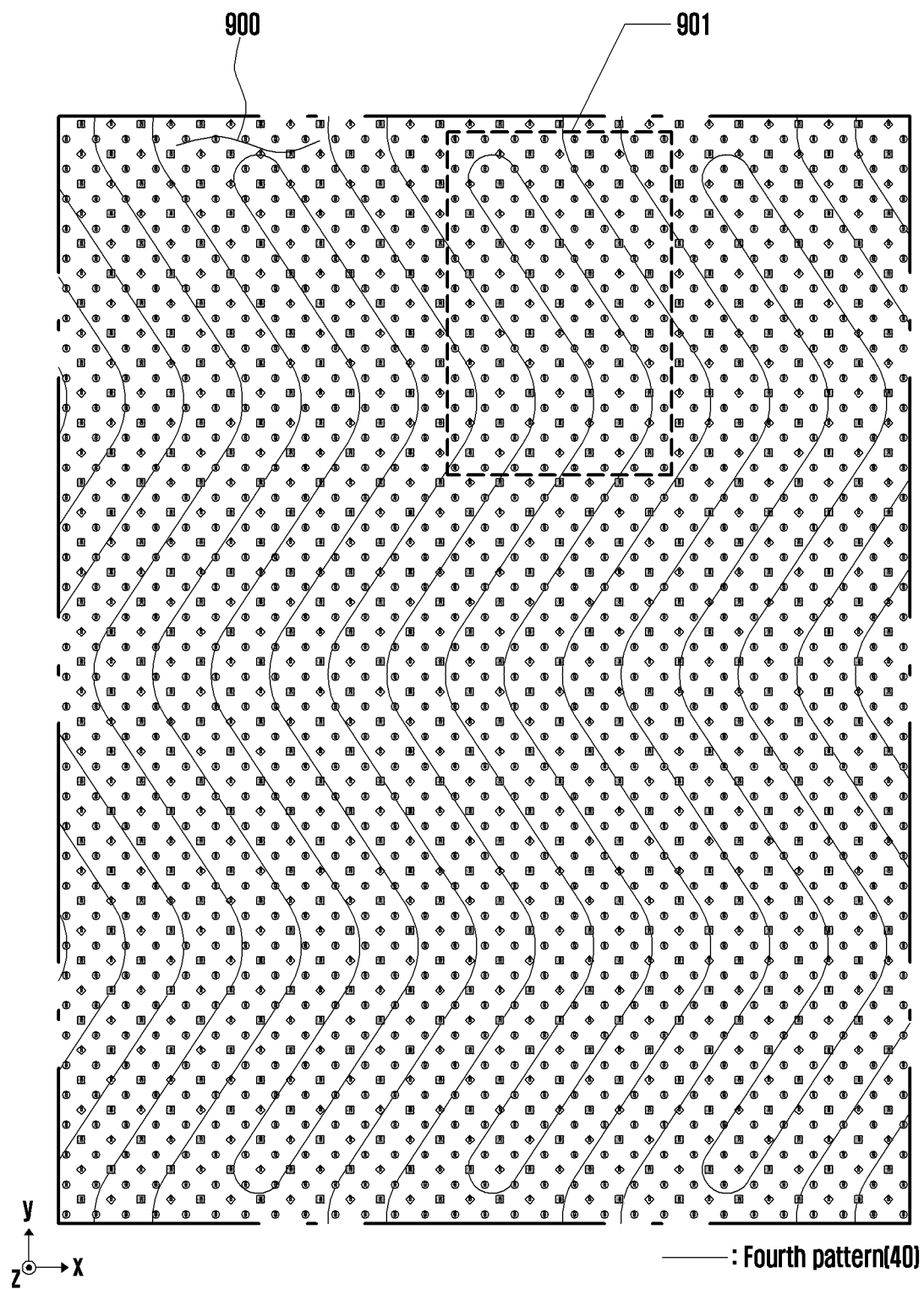
FIG. 9 is a diagram illustrating a positional relationship between a lattice structure included in a front cover and a plurality of sub-pixels included in a flexible display in an unfolded state of an electronic device, according to an embodiment of the disclosure.

FIG. 9 is a diagram (e.g., the x-y plan view) illustrating a positional relationship between a lattice structure included in a front cover and a plurality of sub-pixels 900 included in a flexible display in an unfolded state of an electronic device 1, according to an embodiment of the disclosure.

Figure 10:
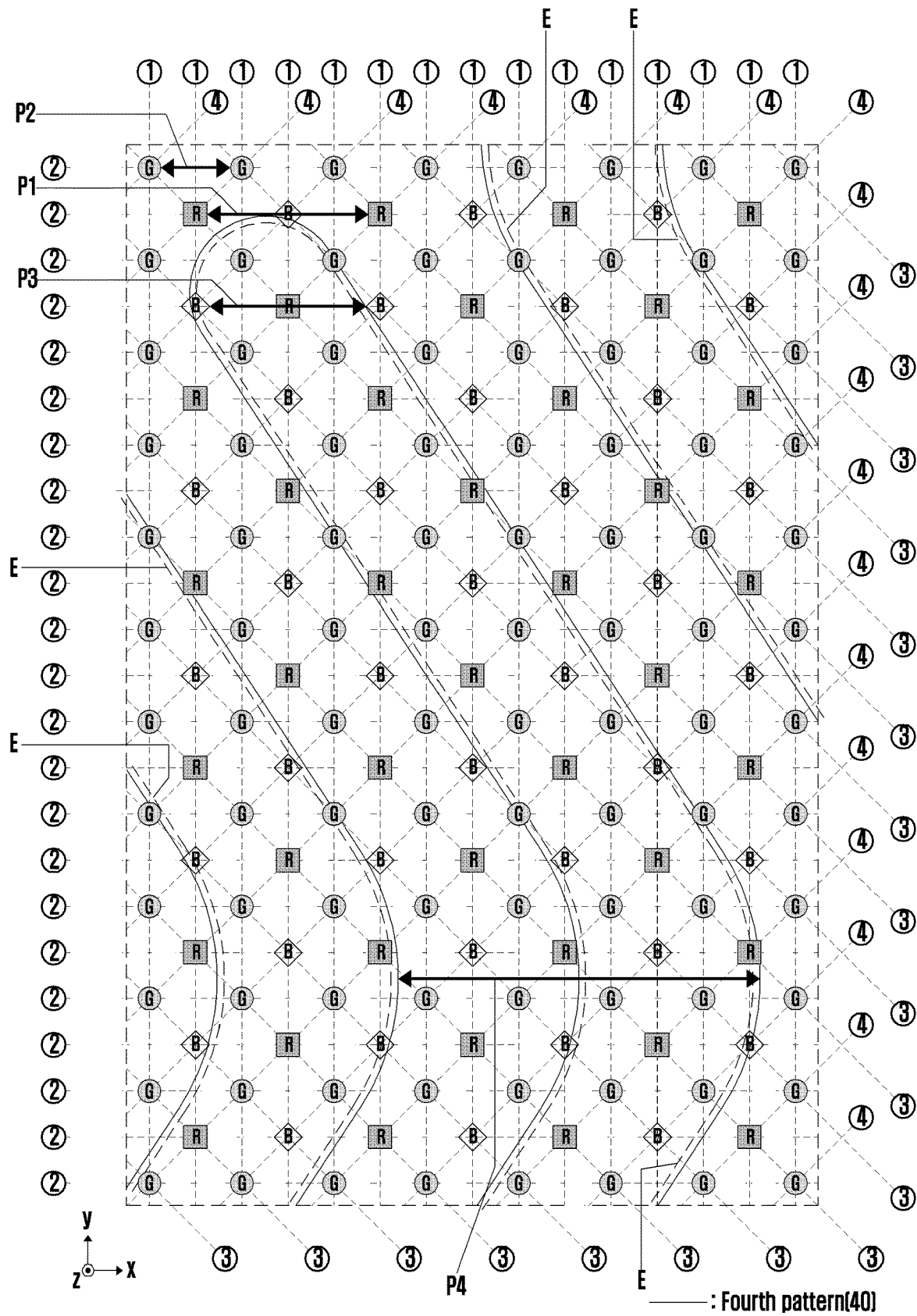
FIG. 10 is an enlarged view of a portion indicated by reference numeral '901' in FIG. 9, according to an embodiment of the disclosure.

FIG. 10 is an enlarged view of a portion indicated by reference numeral '901' in FIG. 9, according to an embodiment of the disclosure.

Referring to FIGS. 9 and 10, the plurality of sub-pixels 900 may include red sub-pixels R outputting red light (or expressing a red color), green sub-pixels G outputting green light (or expressing a green color), and blue sub-pixels B outputting blue light (or expressing a blue color). The plurality of sub-pixels 900 may be included in, for example, the light emitting layer 21a (see FIG. 5) of the display panel 21. One pixel (or unit pixel) may be implemented with three sub-pixels, for example, a red sub-pixel R, a green sub-pixel G, and a blue sub-pixel B. The arrangement of the plurality of sub-pixels 900 may be implemented differently from the illustrated example. For example, one pixel may be implemented with two sub-pixels, for example, a red sub-pixel R and a green sub-pixel G, or a blue sub-pixel B and a green sub-pixel G, and the arrangement of the plurality of sub-pixels 900 may be modified differently from the illustrated example. The light outputted from the red sub-pixel R, the light outputted from the green sub-pixel G, and the light outputted from the blue sub-pixel B may have different wavelengths.

The red sub-pixels R may provide (or form) a first pattern arranged at a first pitch (or first interval) P1 in substantially the same direction as a direction in which the plurality of openings 401 (see FIG. 3, 7, or 8) or the plurality of recesses 601 (see FIG. 6) included in the fourth pattern 40 of the first layer 310 are arranged at the fourth pitch (or fourth interval) P4. The green sub-pixels G may provide (or form) a second pattern arranged at a second pitch (or second interval) P2 in substantially the same direction as a direction in which the plurality of openings 401 or the plurality of recesses 601 included in the fourth pattern 40 of the first layer 310 are arranged at the fourth pitch P4. The blue sub-pixels B may provide (or form) a third pattern arranged at a third pitch (or third interval) P3 in substantially the same direction as a direction in which the plurality of openings 401 or the plurality of recesses 601 included in the fourth pattern 40 of the first layer 310 are arranged at the fourth pitch P4. The first pitch P1, the second pitch P2, or the third pitch P3 may be, but is not limited to, about 30 μm to about 300 μm.

Based on Fourier transform, a spatial frequency vector provided (or formed) through convolution summation of a fourth spatial frequency vector provided (or formed) due to the fourth pitch P4 of the fourth pattern 40 included in the first layer 310 and a first spatial frequency vector provided (or formed) due to the first pitch P1 of the first pattern for the red sub-pixels R may be located within a visibility circle with respect to about 60 cycles/degree corresponding to the limit pitch that can be perceived by a person, and thus the moire phenomenon may not occur substantially. The fourth pitch P4 is formed to be greater than the first pitch PI, so that the moire phenomenon may be reduced. For example, the first pitch PI may be formed to have a value corresponding to about 0.01 to about 0.8 compared to the fourth pitch P4, based on a spatial frequency vector based on the Fourier transform, thereby reducing the moire phenomenon. In some embodiments, the ratio of the first pitch PI to the fourth pitch P4 may not be limited to the above value.

Based on Fourier transform, a spatial frequency vector provided (or formed) through convolution summation of a fourth spatial frequency vector provided (or formed) due to the fourth pitch P4 of the fourth pattern 40 included in the first layer 310 and a second spatial frequency vector provided (or formed) due to the second pitch P2 of the second pattern for the green sub-pixels G may be located within a visibility circle with respect to about 60 cycles/degree corresponding to the limit pitch that can be perceived by a person, and thus the moire phenomenon may not occur substantially. In an embodiment, the fourth pitch P4 is formed to be greater than the second pitch P2, so that the moire phenomenon may be reduced. For example, the second pitch P2 may be formed to have a value corresponding to about 0.01 to about 0.8 compared to the fourth pitch P4, based on a spatial frequency vector based on the Fourier transform, thereby reducing the moire phenomenon. In some embodiments, the ratio of the second pitch P2 to the fourth pitch P4 may not be limited to the above value.

Based on Fourier transform, a spatial frequency vector provided (or formed) through convolution summation of a fourth spatial frequency vector provided (or formed) due to the fourth pitch P4 of the fourth pattern 40 included in the first layer 310 and a third spatial frequency vector provided (or formed) due to the third pitch P3 of the third pattern for the blue sub-pixels B may be located within a visibility circle with respect to about 60 cycles/degree corresponding to the limit pitch that can be perceived by a person, and thus the moire phenomenon may not occur substantially. The fourth pitch P4 is formed to be greater than the third pitch P3, so that the moire phenomenon may be reduced. For example, the third pitch P3 may be formed to have a value corresponding to about 0.01 to about 0.8 compared to the fourth pitch P4, based on a spatial frequency vector based on the Fourier transform, thereby reducing the moire phenomenon. In some embodiments, the ratio of the third pitch P3 to the fourth pitch P4 may not be limited to the above value.

The plurality of openings 401 (see FIG. 3) or the plurality of recesses 601 included in the fourth pattern 40 of the first layer 310 may have edges E. The edge E of the fourth pattern 40 may indicate (or be defined or interpreted as) an edge shape of the plurality of openings 401 or the plurality of recesses 601 in a direction substantially parallel to the display panel 21 (see FIG. 5) including the plurality of sub-pixels 900. For example, in the embodiment of FIG. 3, the edge E of the fourth pattern 40 may correspond to a surface (e.g., an inner surface) included in the plurality of openings 401 while being substantially perpendicular to the third surface 303 or the fourth surface 304. The first layer 310 may be provided (or formed) as a thin film having a thickness of, for example, about 30 μm to about 1000 μm, and the surface included in the plurality of openings 401 may be interpreted as having an insignificant height compared to the width of the plurality of openings 401. Various other terms may be used to replace the term 'edge'.

An arrangement direction may be defined with respect to the red sub-pixels R, the green sub-pixels G, or the blue sub-pixels B in the plurality of sub-pixels 900. The arrangement direction with respect to the plurality of sub-pixels 900 may be defined, for example, based on a combination of two sub-pixels that output light of the same wavelength (or same color) and are located adjacent to each other at a distance that can substantially affect each other (e.g., interference of light). For example, the arrangement directions of the red sub-pixels emitting light of a first wavelength of red color, the green sub-pixels emitting light of a second wavelength of green color, and the blue sub-pixels emitting light of a third wavelength of blue color may include, as shown, a first arrangement direction ①, a second arrangement direction ②, a third arrangement direction ③, and/or a fourth arrangement direction ④.

In order to reduce the moire phenomenon, the edge E of the fourth pattern 40 included in the first layer 310 may be provided (or formed) so as not to be substantially parallel to the first arrangement direction ①, the second arrangement direction ②, the third arrangement direction 33, and the fourth arrangement direction ④ with respect to the plurality of sub-pixels 900. Because the plurality of sub-pixels corresponding to the first arrangement direction ①, the second arrangement direction ②, the third arrangement direction ③, or the fourth arrangement direction ④ may provide (or form) a visual pattern that may produce the moire phenomenon with the fourth pattern 40 included in the first layer 310 due to an influence (e.g., interference) between two neighboring sub-pixels emitting light of the same wavelength, the edge E of the fourth pattern 40 may be provided (or formed) so as not to be parallel to the first arrangement direction ①, the second arrangement direction ②, the third arrangement direction ③, and the fourth arrangement direction ④. The edge E of the fourth pattern 40 may have at least one straight section (or straight line shape), and the at least one straight section of the edge E may not be substantially parallel to the first arrangement direction ①, the second arrangement direction ②, the third arrangement direction ③, and the fourth arrangement direction ④. For example, the at least one straight section of the edge E may form an angle within a range corresponding to a level of preventing or reducing (e.g., minimizing) the moire phenomenon with the first arrangement direction ①, the second arrangement direction ②, the third arrangement direction ③, or the fourth arrangement direction ④. The above range may about 3 degrees or more from each axis of the first arrangement direction, the second arrangement direction, the third arrangement direction, and the fourth arrangement direction. In some embodiments, the range may not be limited to the above angle. In an embodiment, the edge E of the fourth pattern 40 may have at least one curved section (or curved line shape), and the at least one curved section of the edge E may not be parallel to the first arrangement direction ①, the second arrangement direction ②, the third arrangement direction ③, and the fourth arrangement direction ④. In case of a comparative example in which the edge E of the fourth pattern 40 is provided (or formed) to be substantially parallel to the first arrangement direction ①, the second arrangement direction ②, the third arrangement direction ③, or the fourth arrangement direction ④, it may be difficult to reduce the moire phenomenon due to wavelength mismatch and/or refractive index difference.

Figure 11:
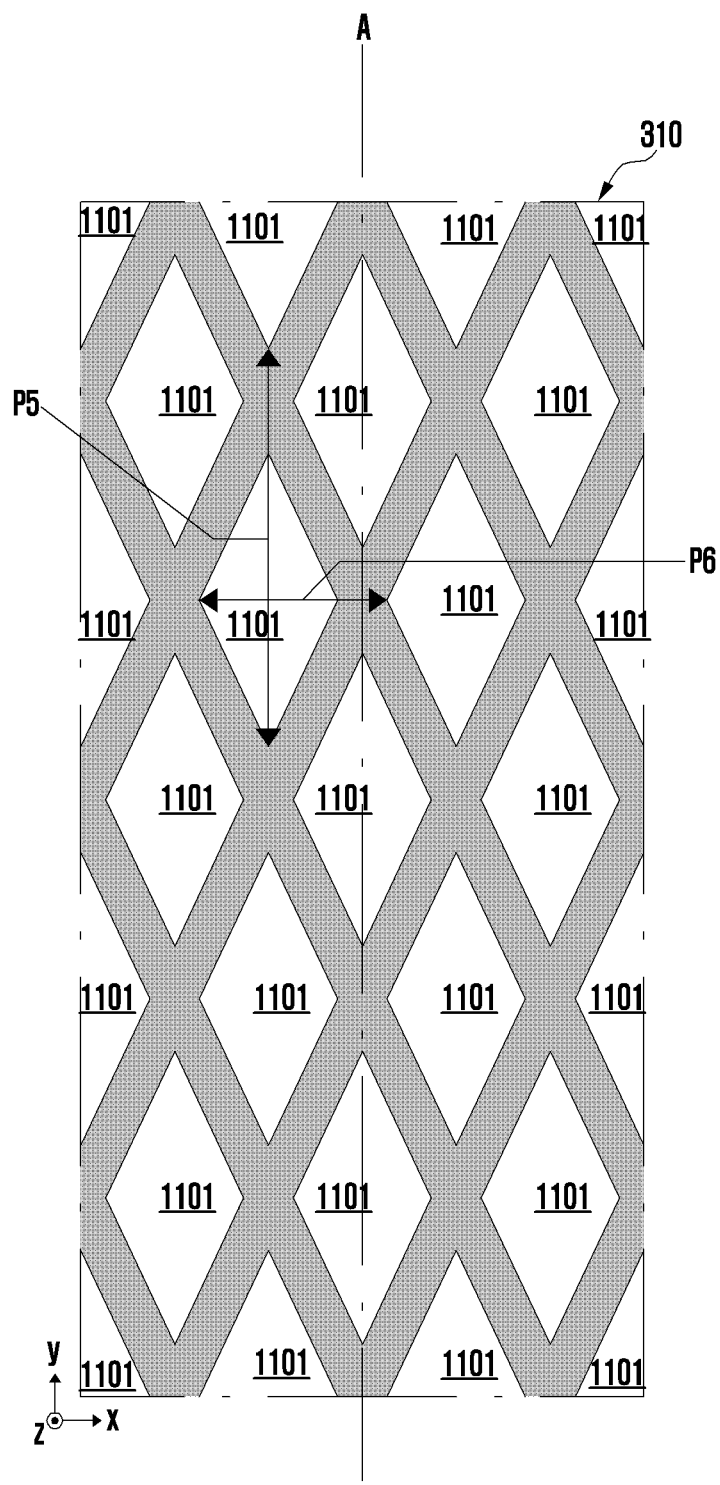
FIG. 11 is a diagram illustrating a first layer including a fourth pattern, according to an embodiment of the disclosure.

FIG. 11 is a diagram (e.g., the x-y plan view) illustrating a first layer including a fourth pattern, according to an embodiment of the disclosure.

Referring to FIG. 11, the first layer 310 may have a fourth pattern including a plurality of openings 1101 having the same shape (e.g., a rhombus shape). The fourth pattern may include a first sub-pattern in which the plurality of openings 1101 are arranged at a fifth pitch P5 in a first direction (e.g., the y-axis direction parallel to the folding axis A). The fourth pattern may include a second sub-pattern in which the plurality of openings 1101 are arranged at a sixth pitch P6 in a second direction perpendicular to the first direction.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the fifth pitch P5 in substantially the same direction as a direction in which the plurality of openings 1101 included in the first sub-pattern of the first layer 310 are arranged at the fifth pitch P5.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the sixth pitch P6 in substantially the same direction as a direction in which the plurality of openings 1101 included in the second sub-pattern of the first layer 310 are arranged at the sixth pitch P6.

In order to reduce the moire phenomenon due to the influence of light between the first layer 310 and the display panel 21 (see FIG. 5), the edges of the plurality of openings 1101 may be provided (or formed) so as not to be substantially parallel to the arrangement directions (e.g., the first arrangement direction ①, the second arrangement direction ②, the third arrangement direction ③, and the fourth arrangement direction ④ in FIG. 8) regarding the plurality of sub-pixels included in the display panel 21.

Figure 12:
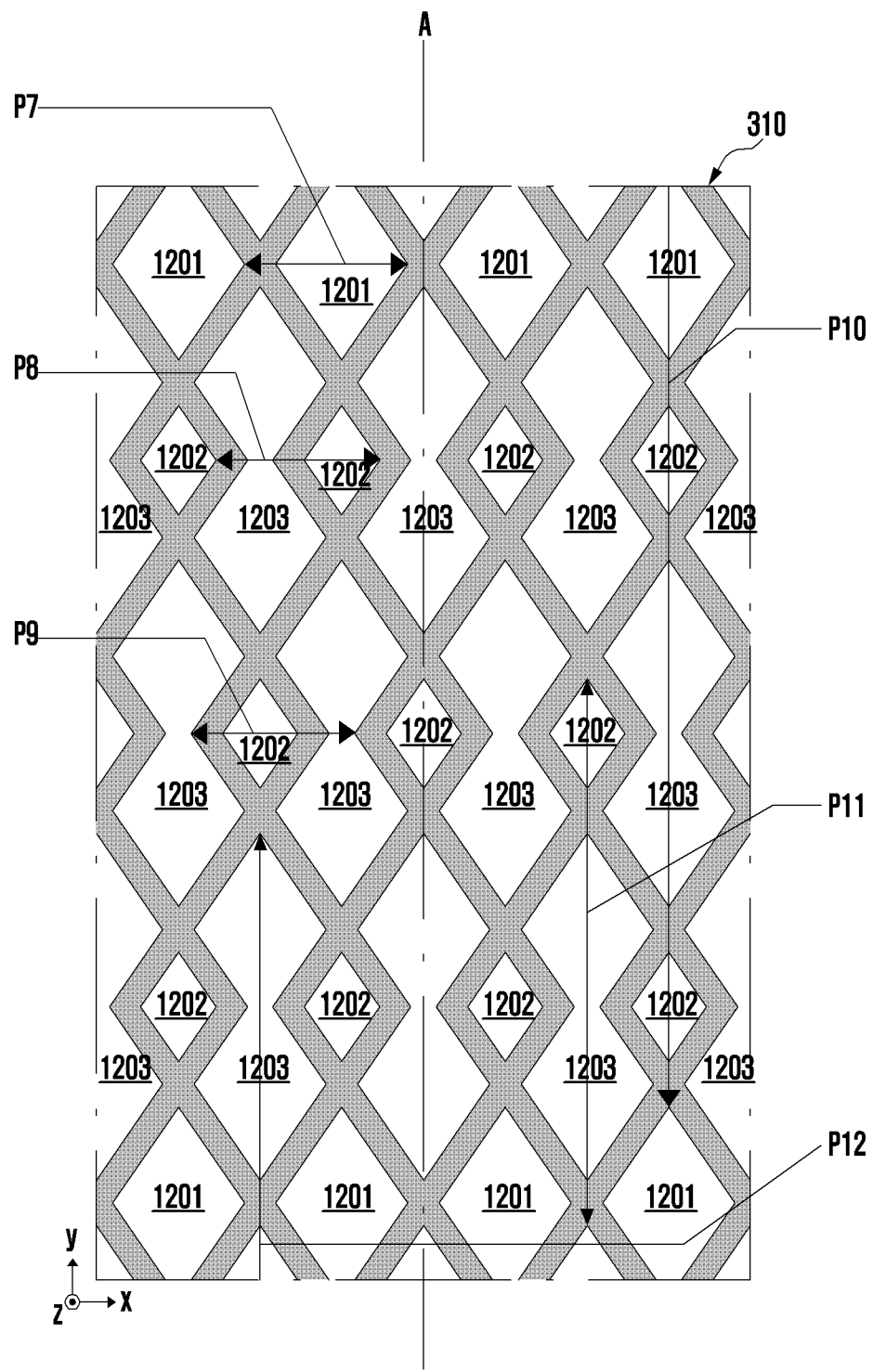
FIG. 12 is a diagram illustrating a first layer including a fourth pattern, according to an embodiment of the disclosure.

FIG. 12 is a diagram (e.g., the x-y plan view) illustrating a first layer including a fourth pattern, according to an embodiment of the disclosure.

Referring to FIG. 12, the fourth pattern of the first layer 310 may include a first sub-pattern in which a plurality of first openings 1201 having a first shape are arranged at a seventh pitch P7 in a first direction (e.g., the x-axis direction perpendicular to the folding axis A). The fourth pattern of the first layer 310 may include a second sub-pattern in which a plurality of second openings 1202 having a second shape are arranged at an eighth pitch P8 in the first direction. The fourth pattern of the first layer 310 may include a third sub-pattern in which a plurality of third openings 1203 having a third shape are arranged at a ninth pitch P9 in the first direction. The fourth pattern of the first layer 310 may include a fourth sub-pattern in which the plurality of first openings 1201 having the first shape are arranged at a tenth pitch P10 in a second direction (e.g., the y-axis direction parallel to the folding axis A) perpendicular to the first direction. The fourth pattern of the first layer 310 may include a fifth sub-pattern in which the plurality of second openings 1202 having the second shape are arranged at an eleventh pitch P11 in the second direction perpendicular to the first direction. The fourth pattern of the first layer 310 may include a sixth sub-pattern in which the plurality of third openings 1203 having the third shape are arranged at a twelfth pitch P12 in the second direction perpendicular to the first direction.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the seventh pitch P7 in substantially the same direction as a direction in which the plurality of first openings 1201 included in the first sub-pattern of the first layer 310 are arranged at the seventh pitch P7.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the eighth pitch P8 in substantially the same direction as a direction in which the plurality of second openings 1202 included in the second sub-pattern of the first layer 310 are arranged at the eighth pitch P8.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the ninth pitch P9 in substantially the same direction as a direction in which the plurality of third openings 1203 included in the third sub-pattern of the first layer 310 are arranged at the ninth pitch P9.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the tenth pitch P10 in substantially the same direction as a direction in which the plurality of first openings 1201 included in the fourth sub-pattern of the first layer 310 are arranged at the tenth pitch P10.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the eleventh pitch P11 in substantially the same direction as a direction in which the plurality of second openings 1202 included in the fifth sub-pattern of the first layer 310 are arranged at the eleventh pitch P11.

In order to reduce the moire phenomenon due to the influence of light between the first layer 310 and the display panel 21 (see FIG. 5), the plurality of red sub-pixels, the plurality of green sub-pixels, or the plurality of blue sub-pixels included in the display panel 21 may be arranged to provide (or form) a pattern at a pitch smaller than the twelfth pitch P12 in substantially the same direction as a direction in which the plurality of third openings 1203 included in the sixth sub-pattern of the first layer 310 are arranged at the twelfth pitch P12.

In order to reduce the moire phenomenon due to the influence of light between the first layer 310 and the display panel 21 (see FIG. 5), the edges of the plurality of first openings 1201, the edges of the plurality of second openings 1202, and the edges of the plurality of third openings 1203 may be provided (or formed) so as not to be substantially parallel to the arrangement directions (e.g., the first arrangement direction ①, the second arrangement direction ②, the third arrangement direction ③, and the fourth arrangement direction ④ in FIG. 8) regarding the plurality of sub-pixels included in the display panel 21.

The fourth pattern included in the first layer 310 may be implemented in various other forms that can secure flexibility while reducing the moire phenomenon due to the influence of light between the first layer 310 and the display panel 21 (see FIG. 5).

With reference to FIG. 3, 6, 7, or 8, a load may be applied or transferred from the outside to the front cover 101 (e.g., the window or the front plate) for various reasons. For example, when a user input is performed by bringing the pen tip of the pen input device into contact with the first surface 101 of the front cover 101, a load (or pressure load) may be applied or transferred to the front cover 101 due to the pressure of the pen input device. In another example, when an object such as the pen input device is dropped and collided with the front cover 101, a load (e.g., an impact load) may be applied to or transferred to the front cover 101. For various other reasons, a load may be applied to or transferred to the front cover 101. The first layer 310 included in the front cover 101 may substantially affect the strength or durability of the front cover 101. In the case that a load from the outside is applied to the first surface 301 of the front cover 101, this load may be indirectly transferred to the first layer 310 through the third layer 330 and the fourth layer 340. In the case that the third layer 330 and the fourth layer 340 are omitted, a load from the outside may be directly applied to the first layer 310. In an embodiment, the first layer 310 or the front cover 101 may be implemented to reduce or prevent breakage against a load from the outside.

The first layer 310 (see FIG. 3) or the front cover 101 (see FIG. 3) may be implemented to be bendable with a reduced bending stress without breakage during a change between the unfolded state and the folded state of the electronic device 1 (see FIG. 1). The first layer 310 or the front cover 101 may be implemented such that the electronic device 1 can be restored to a substantially flat state during a change from the folded state to the unfolded state.

The first layer 310 (see FIG. 3) may include thin glass (or ultra-thin glass), and the thin glass may be implemented to reduce breakage against external stress.

The thin glass (e.g., the first layer 310) may be implemented to secure or improve strength (e.g., fracture strength). In order to reduce or prevent the breakage of the thin glass against a load from the outside, the strength of the thin glass can be secured or improved through strengthening. Because the compression stress (or compressive force) of the surface of the thin glass (e.g., the third surface 303 or the fourth surface 304 in FIG. 3) may be increased through strengthening, the thin glass can have strength (e.g., surface strength) capable of reducing or preventing breakage against stress from the outside. Through strengthening, the thin glass may have a surface (e.g., the third surface 303 or the fourth surface 304 in FIG. 3) secured or improved in mechanical strength (e.g., impact resistance and abrasion resistance), have a compressive stress layer providing this surface, or have a compressive stress surface.

Strengthening of the thin glass (e.g., the first layer 310) may include thermal strengthening or chemical strengthening. Thermal strengthening may be to improve mechanical strength through thermal stress generated by heat-treating thin glass (e.g., by applying high heat). Chemical strengthening may be to improve mechanical strength by injecting a material for mechanical strength into thin glass.

An inside portion (or inner region) of the thin glass (e.g., the first layer 310) in contact with the compressive stress layer or compressive stress surface provided through strengthening may have toughness (e.g., toughness that is difficult to be destroyed by an external force and resistant to strong impact). The fatigue life of the thin glass can be ensured or improved against a load from the outside and/or a bending stress occurring during a change between the unfolded state and the folded state of the electronic device 1 (see FIG. 1).

The thin glass (e.g., the first layer 310) may be implemented to have reduced surface defects. The surface defects of the thin glass may be reduced through surface treatment. The Surface treatment may include, for example, etching or polishing. Through the surface treatment, the surface of the thin glass may have uniformity, and the natural smooth touch of glass may be provided.

The strength (e.g., breaking strength) of the first layer 310 (e.g., thin glass) or the front cover 101 may be confirmed through the first evaluation, the second evaluation, or the third evaluation.

The first evaluation may be to drop the pen input device (or an object corresponding to the pen input device) onto the first layer 310, or a stack structure including the first layer 310, disposed on a surface plate and check the drop height of the pen input device causing the breakage of the first layer 310 or the stack structure. The first evaluation may be in consideration of user experience using the pen input device.

The second evaluation may be to press the first layer 310, or a stack structure including the first layer 310, disposed on a surface plate with the pen input device (or an object corresponding to the pen input device) and check the load (or pressure load) causing the breakage of the first layer 310 or the stack structure. The second evaluation may be in consideration of user experience using the pen input device.

The third evaluation may be an evaluation of penetration resistance in accordance with American society for testing method (ASTM) standard (e.g., ASTM F1306-16).

Figure 13:
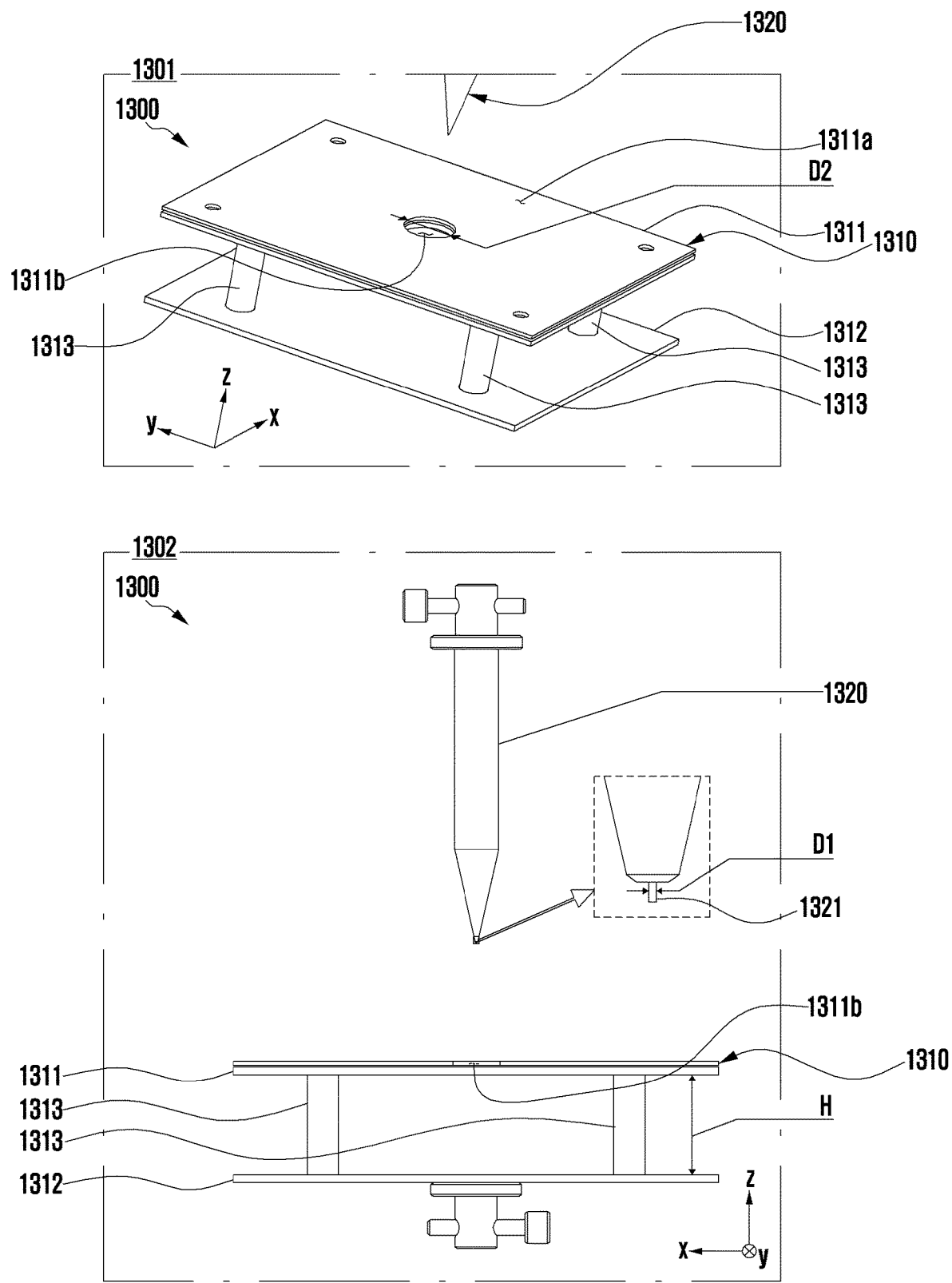
FIG. 13 is perspective view of a test device for a first evaluation, a second evaluation, and a third evaluation, and a diagram illustrating the test device, according to an embodiment of the disclosure.

FIG. 13 is a perspective view 1301 of a test device 1300 for a first evaluation, a second evaluation, and a third evaluation, and a diagram 1302 illustrating the test device 1300, according to an embodiment.

With reference to FIG. 13, in an embodiment, the test device 1300 may include a clamping device (e.g., a manual clamping fixture) 1310 and a probe (e.g., a penetration probe) 1320. A flexible material (e.g., flexible films and/or laminates) (e.g., the first layer 310 in FIG. 3 or a stack structure including the first layer 310) may be disposed on the clamping device 1310. The probe 1320 may be implemented to be linearly movable with respect to the clamping device 1310. The probe 1320 may be linearly moved to apply a load to the flexible material disposed on the clamping device 1310. When the probe 1320 breaks the flexible material, the load (e.g., breaking load) may be detected through a detector (e.g., a sensor) connected to the probe 1320.

The clamping device 1310 may include a first plate 1311, a second plate 1312, and a plurality of support portions 1313.

The first plate 1311 may be a surface plate. The flexible material (e.g., the first layer 310 in FIG. 3 or a stack structure including the first layer 310) to be tested may be disposed on the first plate 1311. The first plate 1311 may have a support surface 1311a on which the flexible material to be tested is disposed. The support surface 1311a of the first plate 1311 may be substantially planar. The first plate 1311 may have an opening 1311b corresponding to the probe 1320. The opening 1311b may reduce or prevent the effect of the first plate 1311 on detecting the strength of the flexible material. The opening 1311b may prevent the first plate 1311 from interfering with the linear movement of the probe 1320.

The second plate 1312 may be spaced apart from the first plate 1311 in a direction in which the probe 1320 is linearly moved to press the flexible material (e.g., the first layer 310 in FIG. 3 or a stack structure including the first layer 310). A space between the first plate 1311 and the second plate 1312 may prevent the clamping device 1310 from interfering with the linear movement of the probe 1320. The plurality of support portions 1313 may be disposed between the first plate 1311 and the second plate 1312. The plurality of support portions 1313 may connect the first plate 1311 and the second plate 1312. The second plate 1312 may be combined with a body (not shown) included in the test device 1300, and the first plate 1311 may be supported by the plurality of support portions 1313 and spaced apart from the second plate 1312 combined with the body. The body of the test device 1300 is a substantial support body for stably supporting components such as the probe 1320 and the second plate 1312 and may reduce vibration or shaking when the test device 1300 operates.

The first layer 310 in FIG. 3 or a stack structure including the first layer 310 may be disposed on the support surface 1311a of the first plate 1311. For example, the fourth surface 304 (see FIG. 3) of the first layer 310 may face the support surface 1311a, and the third surface 303 (see FIG. 3) of the first layer 310 may substantially face a direction in which the substantially planar support surface 1311a faces.

The probe 1320 may include a pen input device (e.g., an electronic pen, a digital pen, or a stylus pen). The pen input device may be disposed in the test device 1300 while being erected in a direction substantially perpendicular to the support surface 1311*a* of the first plate 1311. When the test device 1300 operates, a pen tip 1321 of the pen input device may press the first layer 310 (e.g., thin glass, see FIG. 3) disposed on the first plate 1311. It may be understood that, in the test device 1300, what the vertically erected pen input device is moved and applies a load to the first layer 310 (see FIG. 3) is at least similar to a situation in which the user misses and drops the pen input device or a situation in which the user performs a touch input with the pen input device.

The pen input device may substantially weigh about 5.6 g.

The diameter D1 of the pen tip 1321 included in the pen input device may be substantially about 0.3 mm.

The pen tip 1321 of the pen input device may be a ball tip made of tungsten carbide. The ball tip may be provided in the form of a curved surface having a convex end.

The probe 1320 may be provided as an object that can substantially replace the pen input device.

The test device 1300 may comply with the ASTM F1306-16 standard for evaluating penetration resistance for a flexible material in relation to the third evaluation. The probe 1320 may be provided in accordance with the ASTM F1306-16 standard. According to the ASTM F1306-16 standard, the support surface 1311*a* of the first plate 1311 may have a surface roughness of substantially about 200 µm. According to the ASTM F1306-16 standard, the diameter D2 of the opening 1311*b* of the first plate 1311 may be substantially about 35 mm. According to the ASTM F1306-16 standard, a distance H between the first plate 1311 and the second plate 1312 in the linear movement direction of the probe 1320 may be substantially about 76 mm.

The first evaluation and the second evaluation may be substantially performed through the test device 1300 in accordance with the ASTM F1306-16 standard.

Figure 14:
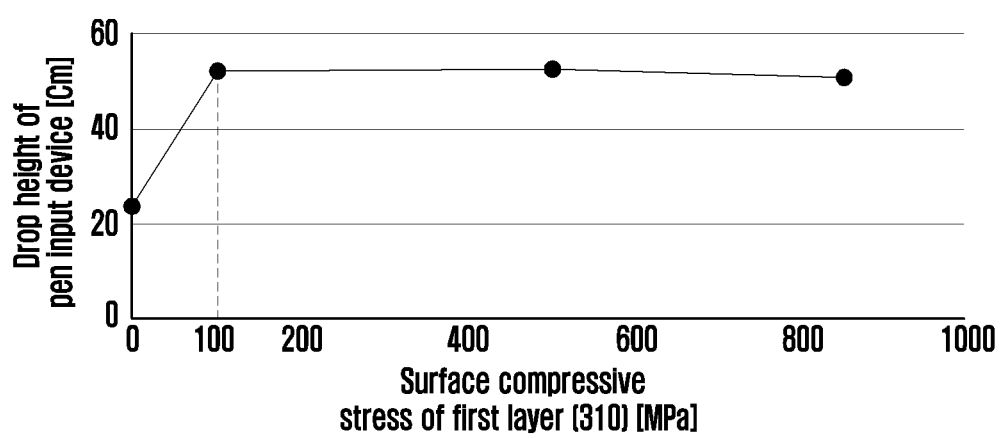
FIG. 14 is a graph showing the minimum surface compressive stress that a first layer should have so as not to substantially cause breakage of the first layer depending on a drop height of a pen input device, according to an embodiment of the disclosure.

FIG. 14 is a graph showing the minimum surface compressive stress that a first layer 310 (e.g., the thin glass, see FIG. 3) should have so as not to substantially cause breakage of the first layer 310 depending on a drop height of a pen input device, according to an embodiment.

The surface compressive stress of the first layer 310 may be a compressive stress of the third surface 303 (see FIG. 3) or the fourth surface 304 (see FIG. 3).

With reference to FIG. 14, in an embodiment, the first layer 310 may have a thickness of substantially about 0.14 mm or of 0.14 mm or less. In order to reduce or prevent the breakage of the first layer 310 when the dropped pen input device applies an impact to the first layer 310, the first layer 310 may be implemented to have a surface compressive stress of about 100 MPa or of 100 MPa or more.

Figure 15:
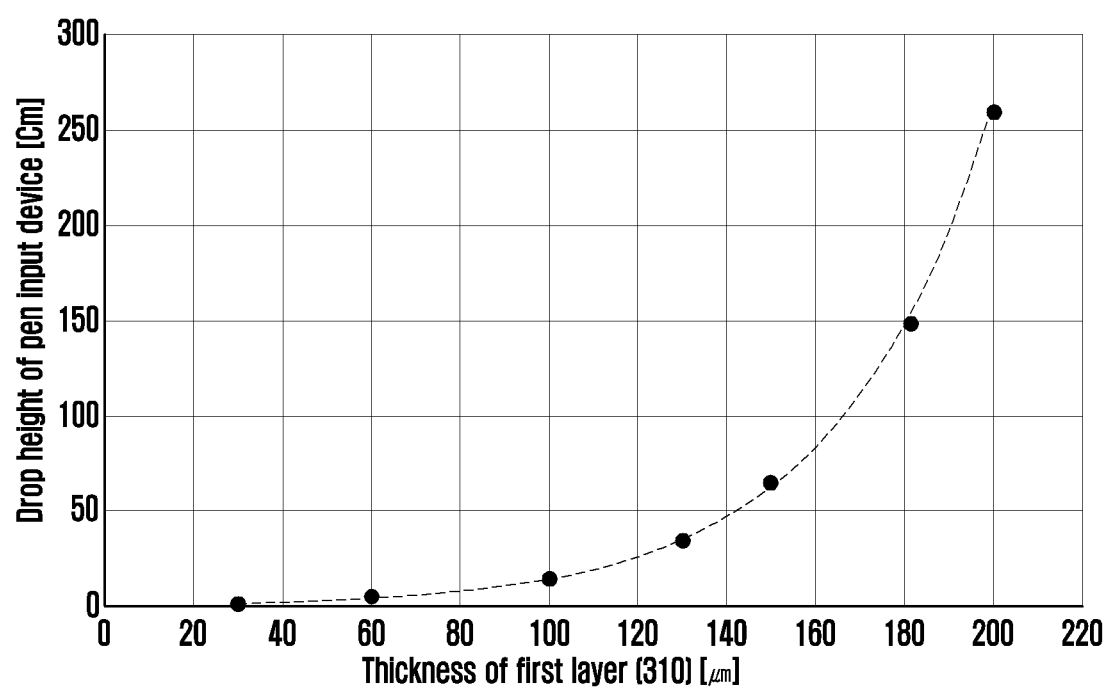
FIG. 15 is a graph showing the drop height of the pen input device causing breakage of the first layer depending on the thickness of the first layer, as the first evaluation of a stack structure including the first layer of FIG. 3, according to an embodiment of the disclosure.

FIG. 15 is a graph showing the drop height of the pen input device causing breakage of the first layer 310 depending on the thickness of the first layer 310, as the first evaluation of a stack structure including the first layer 310 of FIG. 3, according to an embodiment.

The stack structure including the first layer 310 (e.g., thin glass) in FIG. 3 may include the first layer 310, a flexible display (e.g., the flexible display 20 in FIG. 3), and an adhesive material (e.g., the optically transparent adhesive member 350 in FIG. 3) between the first layer 310 and the flexible display.

With reference to FIG. 15, as the thickness of the first layer 310 (e.g., thin glass, see FIG. 3) included in the stack structure increases, the drop height of the pen input device causing the breakage of the first layer 310 may be great. In an embodiment, the thickness of the first layer 310 may be limited to a value at which the electronic device 1 (see FIG. 1) can be bent while reducing bending stress without breakage during a change from the unfolded state to the folded state. In an embodiment, the thickness of the first layer 310 may be limited to a value capable of reducing the radius of curvature or the curvature as much as possible without breakage (or reducing bending stress) during bending.

Figure 16:
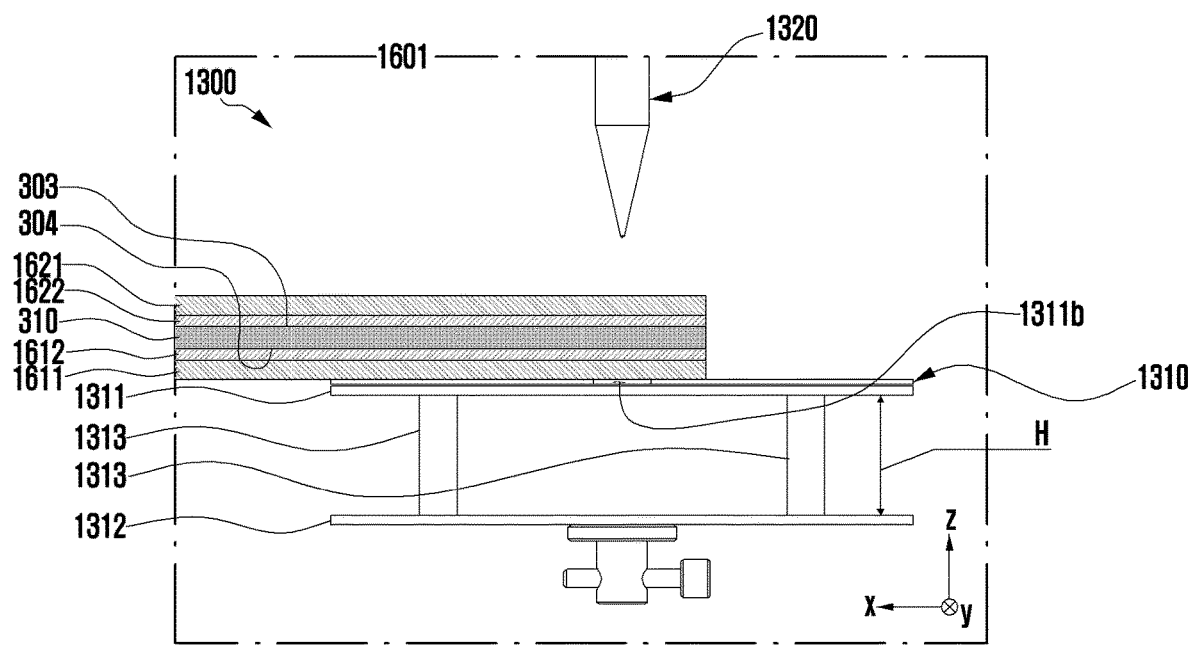
FIG. 16 is a diagram illustrating the test device and the first layer in relation to the first evaluation and a diagram illustrating the test device and the first layer in relation to the second evaluation, according to an embodiment of the disclosure.
Figure 16:
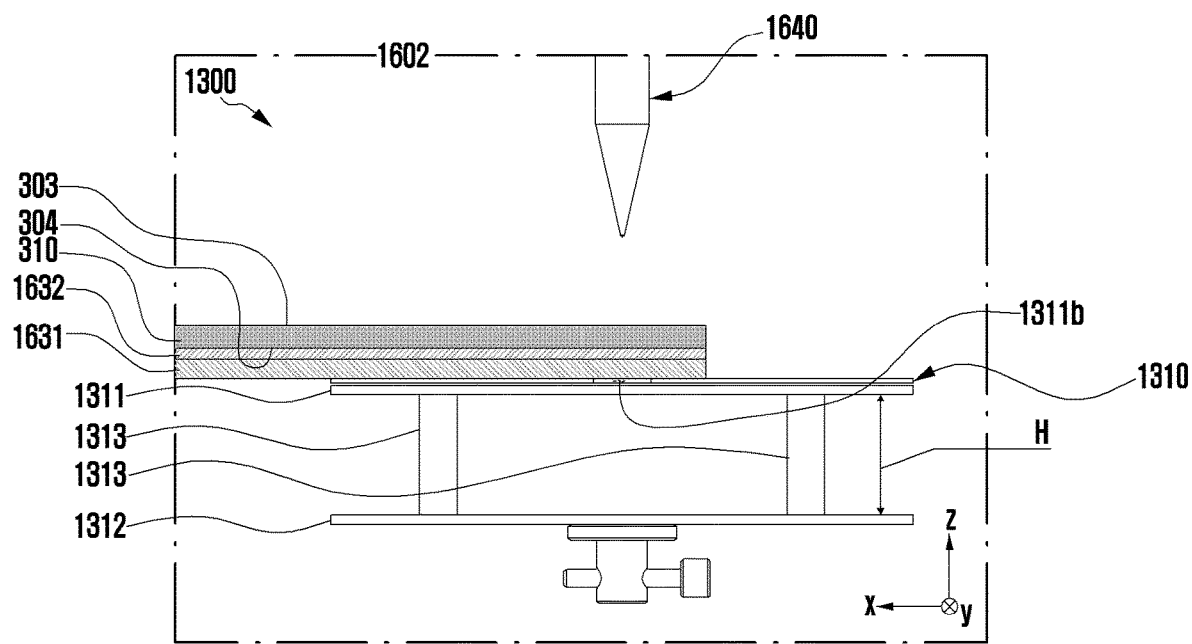

FIG. 16 is a diagram 1601 illustrating the test device 1300 and the first layer 310 (e.g., thin glass) in relation to the first evaluation and a diagram 1602 illustrating the test device 1300 and the first layer 310 in relation to the second evaluation, according to an embodiment.

With reference to FIG. 16, in the first evaluation through the test device 1300, a first protective film 1611 of polymer may be disposed on (e.g., attached to) the third surface 303 of the first layer 310 (e.g., thin glass) through a first adhesive material 1612. In the first evaluation through the test device 1300, a second protective film 1621 of polymer may be disposed on (e.g., attached to) the fourth surface 304 of the first layer 310 through a second adhesive material 1622. The first protective film 1611 and the second protective film 1621 may be, for example, polyethylene terephthalate (PET) having a thickness of substantially about 50 µm. The first adhesive material 1612 and the second adhesive material 1622 may be, for example, a pressure sensitive adhesive (PSA) having a thickness of substantially about 25 µm or of 25 µm or less.

In the second evaluation through the test device 1300, a protective film 1631 of polymer may be disposed on (e.g., attached to) the fourth surface 304 of the first layer 310 (e.g., thin glass) through an adhesive material 1632. The protective film 1631 may be, for example, PET having a thickness of substantially about 200 µm. The adhesive material 1632 may be, for example, PSA having a thickness of about 10 µm or of 10 µm or less. In an embodiment, in the second evaluation through the test device 1300, a protective film (e.g., a urethane jig, not shown) of Hs30 hardness may be located to cover the fourth surface 304 of the first layer 310.

Figure 17:
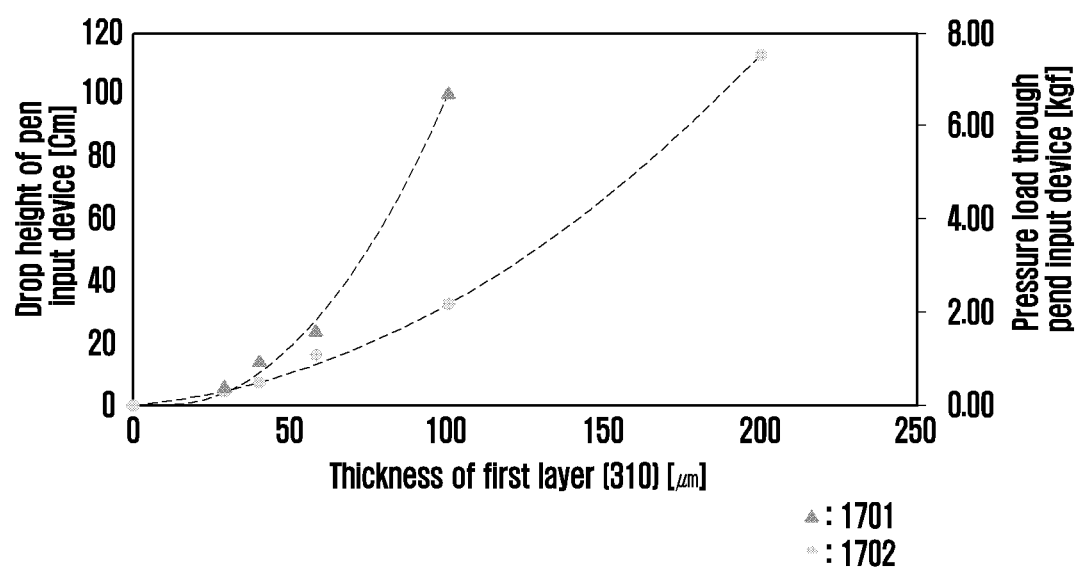
FIG. 17 is a graph showing the drop height of the pen input device causing breakage of the first layer depending on the thickness of the first layer as a result of the first evaluation through the test device, and a graph showing a pressure load through the pen input device causing breakage of the first layer depending on the thickness of the first layer as a result of the second evaluation through the test device, according to an embodiment of the disclosure.
Figure 18:
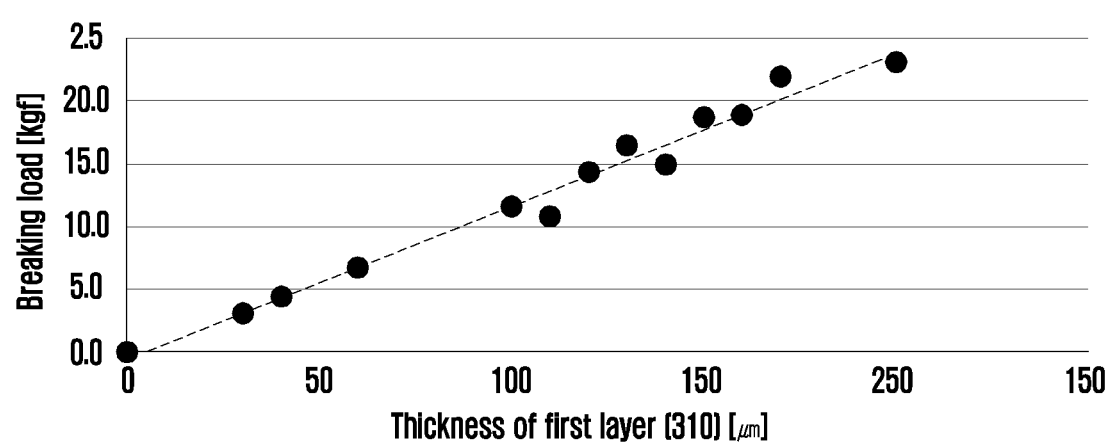
FIG. 18 is a graph showing a breaking load depending on the thickness of the first layer, as a result of the third evaluation through the test device, according to an embodiment Throughout the drawings, it should be noted that like reference numbers are used to depict the same or similar elements, features, and structures.

FIG. 17 is a graph 1701 showing the drop height of the pen input device (e.g., the probe 1320 in FIG. 16) causing breakage of the first layer 310 (e.g., thin glass, see FIG. 3) depending on the thickness of the first layer 310 as a result of the first evaluation through the test device 1300 (see FIG. 13), and a graph 1702 showing a pressure load through the pen input device causing breakage of the first layer 310 depending on the thickness of the first layer 310 as a result of the second evaluation through the test device 1300, according to an embodiment. FIG. 18 is a graph showing a breaking load depending on the thickness of the first layer 310 (e.g., thin glass, see FIG. 3), as a result of the third evaluation (e.g., a penetration resistance evaluation in accordance with the ASTM F1306-16 standard) through the test device 1300 (see FIG. 13), according to an embodiment.

In consideration of the first evaluation result shown in FIG. 17, the first layer 310 (e.g., thin glass, see FIG. 3) may be implemented such that the drop height of the pen input device that may break the first layer 310 is about 6 cm or is 6 cm or more.

In consideration of the second evaluation result shown in FIG. 17, the first layer 310 may be implemented such that the pressure load through the pen input device that may break the first layer 310 is about 0.3 kgf or is 0.3 kgf or more.

In consideration of the third evaluation result shown in FIG. 18, the first layer 310 may be implemented such that the penetration resistance (e.g., breaking load or breaking strength) is about 3 kgf or is 3 kgf or more.

According to an embodiment of the disclosure, an electronic device (e.g., the electronic device 1 in FIG. 1) may include a foldable housing (e.g., the foldable housing 10 in FIG. 1) that provides (or forms) a front surface (e.g., the front surface 10A in FIG. 1) of the electronic device and a rear surface (e.g., the rear surface 10B in FIG. 1) of the electronic device. The electronic device may include a flexible display (e.g., the flexible display 20 in FIG. 3 or 6) located in an inner space of the foldable housing. The flexible display may be combined with a front cover (e.g., the front cover 101 in FIG. 3 or 6) of the foldable housing providing (or forming) the front surface of the electronic device, and viewed through the front cover. The front cover may include a pattern (e.g., the pattern 40 in FIG. 4 or 10) in which a plurality of openings (e.g., the plurality of openings 401 in FIG. 3, 7, or 8) corresponding to a folding portion of the foldable housing or a plurality of recesses (e.g., the plurality of recesses 601 in FIG. 6) provided (or formed) in a surface facing the flexible display are periodically provided. The plurality of openings or the plurality of recesses may be periodically arranged at a first interval (e.g., the fourth pitch P4 in FIG. 3, 6, 7, or 8). A plurality of sub-pixels emitting light of a same wavelength in the flexible display may be arranged in a same direction as a direction in which the plurality of openings or the plurality of recesses are periodically arranged. The first interval may be greater than a second interval (e.g., the first pitch P1, the second pitch P2, or the third pitch P3 in FIG. 10) at which the plurality of sub-pixels are periodically arranged.

A ratio of the second interval (e.g., the first pitch P1, the second pitch P2, or the third pitch P3 in FIG. 10) to the first interval (e.g., the fourth pitch P4 in FIG. 3, 6, 7, or 8) may be 0.01:1 to 0.8:1.

An edge shape (e.g., the edge E in FIG. 10) of the plurality of openings (e.g., the plurality of openings 401 in FIG. 3, 7, or 8) or the plurality of recesses (e.g., the plurality of recesses 601 in FIG. 6) in at least one direction parallel to the flexible display may be formed (or provided) so as not to be parallel to one or more directions in which the plurality of sub-pixels emitting light of the same wavelength in the flexible display are periodically arranged.

The edge shape (e.g., the edge E in FIG. 10) of the plurality of openings (e.g., the plurality of openings 401 in FIG. 3, 7, or 8) or the plurality of recesses (e.g., the plurality of recesses 601 in FIG. 6) in at least one direction parallel to the flexible display may include a straight section. The straight section may form an angle of 3 degrees or more with the one or more directions in which the plurality of sub-pixels emitting light of the same wavelength in the flexible display are periodically arranged.

The edge shape (e.g., the edge E in FIG. 10) of the plurality of openings (e.g., the plurality of openings 401 in FIG. 3, 7, or 8) or the plurality of recesses (e.g., the plurality of recesses 601 in FIG. 6) in at least one direction parallel to the flexible display may further include a straight section or a curved section forming an angle of 3 degrees or more with the one or more directions in which the plurality of sub-pixels emitting light of the same wavelength in the flexible display are periodically arranged.

The plurality of openings (e.g., the plurality of openings 401 in FIG. 3, 7, or 8) or the plurality of recesses (e.g., the plurality of recesses 601 in FIG. 6) may be periodically arranged in a direction of a folding axis (e.g., the folding axis A in FIG. 1) of the foldable housing.

The plurality of openings (e.g., the plurality of openings 401 in FIG. 3, 7, or 8) or the plurality of recesses (e.g., the plurality of recesses 601 in FIG. 6) may be periodically arranged in a direction perpendicular to a folding axis (e.g., the folding axis A in FIG. 1) of the foldable housing when viewed in an unfolded state of the foldable housing.

The plurality of sub-pixels may emit red light, green light, or blue light.

The front cover (e.g., the front cover 101 in FIG. 3, 6, 7, or 8) may include a first layer (e.g., the first layer 310 in FIG. 3, 6, 7, or 8). The first layer may have the pattern (e.g., the pattern 40 in FIG. 4 or 10), and may be formed of glass.

The first layer (e.g., the first layer 310 in FIG. 3, 6, 7, or 8) may have a thickness of 30 μm to 1000 μm.

The first layer (e.g., the first layer 310 in FIG. 3, 6, 7, or 8) may have breaking strength of 3 kgf or of 3 kgf or more based on the ASTM F1306-16 standard.

The first layer (e.g., the first layer 310 in FIG. 3, 6, 7, or 8) may have a surface compressive stress of 100 MPa or of 100 MPa or more.

The electronic device may further include a pen input device. The pen input device may have a weight of 5.6 g. The pen tip of the pen input device may have a diameter of 0.3 mm. When the pen input device is vertically dropped such that the pen tip faces the first layer (e.g., the first layer 310 in FIG. 3, 6, 7, or 8), the first layer may have a strength not to be broken when the drop height of the pen input device is 6 cm or is 6 cm or more.

The electronic device may further include a pen input device. The pen input device may have a weight of 5.6 g. The pen tip of the pen input device may have a diameter of 0.3 mm. When the first layer (e.g., the first layer 310 in FIG. 3, 6, 7, or 8) is pressed by the pen input device through the pen tip, the first layer may have a strength not to be broken against a pressure load of 0.3 kgf or of 0.3 kgf or more.

The first layer (e.g., the first layer 310 in FIG. 3, 6, 7, or 8) may be bent without breaking with a radius of curvature of 5 mm or between 0 mm and 5 mm.

The front cover (e.g., the front cover 101 in FIG. 3 or 6) may further include a second layer (e.g., the second layer 320 in FIG. 3 or 6). The second layer may be positioned between the first layer and the flexible display. The second layer may include polymer, and may have a portion disposed (e.g., filled) in the plurality of openings (e.g., the plurality of openings 401 in FIG. 3) or the plurality of recesses (e.g., the plurality of recesses 601 in FIG. 6).

The front cover (e.g., the front cover 101 in FIG. 3, 6, 7, or 8) may further include a third layer (e.g., the third layer 330 in FIG. 3, 6, 7, or 8) of polymer positioned between the front surface (e.g., the front surface 10A in FIG. 1 or the first layer 301 in FIG. 3, 6, 7, or 8) of the electronic device and the first layer (e.g., the first layer 310 in FIG. 3, 6, 7, or 8).

The electronic device may further include an optically transparent adhesive member (e.g., the optically transparent adhesive member 350 in FIG. 3, 6, 7, or 8) positioned between the second layer (e.g., the second layer 320 in FIG. 3, 6, 7, or 8) and the flexible display (e.g., the flexible display 20 in FIG. 3, 6, 7, or 8).

The foldable housing (e.g., the foldable housing 10 in FIG. 1) may allow the front surface (e.g., the front surface 10A in FIG. 1) of the electronic device to be foldable inward based on a folding axis (e.g., the folding axis A in FIG. 1).

The foldable housing (e.g., the foldable housing 10 in FIG. 1) may allow the front surface (e.g., the front surface 10A in FIG. 1) of the electronic device to be foldable outward based on a folding axis (e.g., the folding axis A in FIG. 1).

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a foldable housing providing a front surface of the electronic device and a rear surface of the electronic device; and
a flexible display located in an inner space of the foldable housing, combined with a front cover of the foldable housing providing the front surface, and viewable through the front cover,
wherein the front cover includes a pattern in which a plurality of openings corresponding to a folding portion of the foldable housing or a plurality of recesses provided in a surface facing the flexible display are periodically provided,
wherein a plurality of sub-pixels emitting light of a same wavelength in the flexible display are arranged in a same direction as a direction in which the plurality of openings or the plurality of recesses are periodically arranged, and
wherein a first interval at which the plurality of openings or the plurality of recesses are periodically arranged is greater than a second interval at which the plurality of sub-pixels are periodically arranged.

2. The electronic device of claim 1, wherein a ratio of the second interval to the first interval is 0.01:1 to 0.8:1.

3. The electronic device of claim 1, wherein an edge shape of the plurality of openings or the plurality of recesses in at least one direction parallel to the flexible display is formed so as not to be parallel to one or more directions in which the plurality of sub-pixels emitting light of the same wavelength in the flexible display are periodically arranged.

4. The electronic device of claim 3,
wherein the edge shape of the plurality of openings or the plurality of recesses in at least one direction parallel to the flexible display includes a straight section, and
wherein the straight section forms an angle of 3 degrees or more with the one or more directions in which the plurality of sub-pixels emitting light of the same wavelength in the flexible display are periodically arranged.

5. The electronic device of claim 4, wherein the edge shape of the plurality of openings or the plurality of recesses in at least one direction parallel to the flexible display further includes a straight section or a curved section forming an angle of 3 degrees or more with the one or more directions in which the plurality of sub-pixels emitting light of the same wavelength in the flexible display are periodically arranged.

6. The electronic device of claim 1, wherein the plurality of openings or the plurality of recesses are periodically arranged in a direction of a folding axis of the foldable housing.

7. The electronic device of claim 1, wherein the plurality of openings or the plurality of recesses are periodically arranged in a direction perpendicular to a folding axis of the foldable housing when viewed in an unfolded state of the foldable housing.

8. The electronic device of claim 1, wherein the plurality of sub-pixels emit red light, green light, or blue light.

9. The electronic device of claim 1,
wherein the front cover includes a first layer having the pattern, and
wherein the first layer is formed of glass.

10. The electronic device of claim 9, wherein the first layer has a thickness of 30 μm to 1000 μm.

11. The electronic device of claim 9, wherein the first layer has breaking strength of 3 kgf or 3 kgf or more based on ASTM F1306-16 standard.

12. The electronic device of claim 9, wherein the first layer has a surface compressive stress of 100 MPa or of 100 MPa or more.

13. The electronic device of claim 9, further comprising:
a pen input device having a weight of 5.6 g and including a pen tip having a diameter of 0.3 mm,
wherein when the pen input device is vertically dropped such that the pen tip faces the first layer, the first layer has a strength not to be broken when a drop height of the pen input device is 6 cm or is 6 cm or more.

14. The electronic device of claim 9, wherein further comprising
a pen input device having a weight of 5.6 g and including a pen tip having a diameter of 0.3 mm,
wherein when the first layer is pressed by the pen input device through the pen tip, the first layer has a strength not to broken against a pressure load of 0.3 kgf or of 0.3 kgf or more.

15. The electronic device of claim 9,
wherein the front cover further includes a second layer of polymer positioned between the first layer and the flexible display, and
wherein the second layer has a portion disposed in the plurality of openings or the plurality of recesses.

16. The electronic device of claim 15, further comprising:
an optically transparent adhesive member positioned between the second layer and the flexible display.

17. The electronic device of claim 9, wherein the front cover further includes a third layer of polymer positioned between the front surface and the first layer.

18. The electronic device of claim 1, wherein the foldable housing allows the front surface to be foldable inward based on a folding axis.

19. The electronic device of claim 1, wherein the foldable housing allows the front surface to be foldable outward based on a folding axis.

20. The electronic device of claim 1, wherein the plurality of openings or the plurality of recesses are formed in a lattice structure.

* * * * *